(12) United States Patent
Koyama

(10) Patent No.: US 8,841,762 B2
(45) Date of Patent: Sep. 23, 2014

(54) SENSOR MODULE, SENSOR DEVICE, MANUFACTURING METHOD OF SENSOR DEVICE, AND ELECTRONIC APPARATUS

(75) Inventor: Yugo Koyama, Ina (JP)

(73) Assignee: Seiko Epson Corporation (JP)

( * ) Notice: Subject to any disclaimer, the term of this patent is extended or adjusted under 35 U.S.C. 154(b) by 265 days.

(21) Appl. No.: 13/440,337

(22) Filed: Apr. 5, 2012

(65) Prior Publication Data

US 2012/0256307 A1    Oct. 11, 2012

(30) Foreign Application Priority Data

Apr. 7, 2011   (JP) ................. 2011-085161

(51) Int. Cl.
H01L 23/48       (2006.01)
H01L 21/00       (2006.01)
G01C 19/5783    (2012.01)
H01L 23/31       (2006.01)
G01C 19/5621    (2012.01)
H01L 23/055     (2006.01)

(52) U.S. Cl.
CPC ..... *G01C 19/5783* (2013.01); *H01L 2924/0002* (2013.01); *H01L 23/055* (2013.01); *B81B 7/0774* (2013.01); *B81B 2201/025* (2013.01); *H01L 2924/09701* (2013.01); *H01L 23/3192* (2013.01); *G01C 19/5621* (2013.01)
USPC .......................................... 257/693; 438/107

(58) Field of Classification Search
CPC .................... H01L 2924/01079; H01L 21/50; H01L 23/538
USPC ............. 257/693, E21.499, E23.169, E23.18, 257/737; 438/107
See application file for complete search history.

(56) References Cited

U.S. PATENT DOCUMENTS

| 4,656,750 A | 4/1987 | Pitt et al. | |
|---|---|---|---|
| 7,467,552 B2 * | 12/2008 | MacGugan | 73/493 |
| 8,207,004 B2 * | 6/2012 | Chen et al. | 438/51 |

FOREIGN PATENT DOCUMENTS

| JP | 07-306047 | 11/1995 |
|---|---|---|
| JP | 11-211481 | 8/1999 |
| JP | 2000-121369 | 4/2000 |
| JP | 2006-284336 | 10/2006 |
| JP | 2007-173668 | 7/2007 |

\* cited by examiner

*Primary Examiner* — Fernando L Toledo
*Assistant Examiner* — Neil Prasad
(74) *Attorney, Agent, or Firm* — Harness, Dickey & Pierce, P.L.C.

(57) ABSTRACT

A sensor module includes a support member having a first flat surface, a second flat surface orthogonally connected to the first flat surface, a third flat surface orthogonally connected to the first flat surface and the second flat surface, and a fourth flat surface opposed to the first flat surface as an attachment surface to an external member, the first flat surface having a support surface depressed from the first flat surface, IC chips having connection terminals on active surface sides with inactive surface sides along the active surfaces respectively attached to the respective surfaces of the support member, and vibration gyro elements having connection electrodes, and the vibration gyro elements are provided on the active surface sides of the IC chips and the connection electrodes are attached to the connection terminals of the IC chips so that principal surfaces are respectively along the respective surfaces of the support member.

21 Claims, 15 Drawing Sheets

SENSOR MODULE, SENSOR DEVICE, MANUFACTURING METHOD OF SENSOR DEVICE, AND ELECTRONIC APPARATUS

BACKGROUND

1. Technical Field

The present invention relates to a sensor module, a sensor device including the sensor module, a manufacturing method of the sensor device, and an electronic apparatus including the sensor module.

2. Related Art

In related art, a sensor device that senses acceleration, an angular velocity, or the like having a sensor module including a sensor element and a circuit element having a function of driving the sensor element and having a configuration in which component elements including the sensor element and the circuit element are attached to a support member in a rectangular parallelepiped shape has been known.

For example, Patent Document 1 (JP-A-2000-121369) discloses a sensor block as a sensor module in which three optical fiber gyros (FOG) each including an optical unit as a sensor element and an electronic circuit unit as a circuit element are attached to three surfaces orthogonal to one another of an attachment block having a rectangular parallelepiped shape (see FIG. 7 of Patent Document 1).

In the sensor module of Patent Document 1 (hereinafter, referred to as "the sensor module"), the three optical fiber gyros are attached to three surfaces orthogonal to one another of the attachment block having the rectangular parallelepiped shape (hereinafter, the attachment block is referred to as "support member"). Further, the sensor module is attached with parts of the respective optical fiber gyros projecting from the respective attachment surfaces.

Further, in the sensor module, of the surfaces to which the optical fiber gyros are not attached, a surface opposed to one surface of the three surfaces (opposite surface) is attached to a mounting surface on an external member of an electronic apparatus or the like.

Recently, in an electronic apparatus, as demands for reduction in size and thickness are increased, reduction in profile (thickness) has been strongly desired for various devices such as sensor devices including the sensor modules mounted within.

However, the sensor module is attached with parts of the respective optical fiber gyros (hereinafter, referred to as "sensor elements and circuit elements") projecting from the respective attachment surfaces of the support member, and thus, there has been a problem that the height from the opposite surface of the support member (the mounting surface on the external member of an electronic apparatus or the like) becomes larger and the reduction in thickness of the sensor device is inhibited by the amount of projection.

As measures for the problem, there is a conceivable configuration in which the shape of the support member may not be the rectangular parallelepiped shape, but a shape formed by bending and raising an L-shaped flat plate in a plan view in the middle of the parts extending in the respective directions from the L-shaped bent part at right angles, for example, and the respective sensor elements and circuit elements are attached to the flat surfaces of the L-shaped bent parts and the flat surfaces of the bent and raised parts.

However, in the configuration, stiffness of the bent and raised parts of the support member is weaker than that in the case of the rectangular parallelepiped shape, and there is a problem that the configuration is liable to vibration (displacement) due to external force, for example.

Accordingly, in the configuration, detection characteristics such as detection accuracy and detection sensitivity by the respective sensor elements attached to the flat surfaces of the bent and raised parts of the support member may be deteriorated.

SUMMARY

An advantage of some aspects of the invention is to solve at least a part of the problems described above, and the invention can be implemented as the following forms or application examples.

APPLICATION EXAMPLE 1

This application example is directed to a sensor module including a support member having a first support surface provided in parallel to a first reference plane within a depression and a second support surface in parallel to a second reference plane orthogonal or tilted with respect to the first reference plane, a first IC chip attached to the first support surface and having a first connection terminal on one surface side, the other surface side along the one surface being an attachment surface to the first support surface, a second IC chip attached to the second support surface and having a second connection terminal on one surface side, the other surface side along the one surface being an attachment surface to the second support surface, a first sensor element provided above the one surface side of the first IC chip with a principal surface along the one surface and having a first connection electrode attached to the first connection terminal, and a second sensor element provided above the one surface side of the second IC chip with a principal surface along the one surface and having a second connection electrode attached to the second connection terminal.

According to the configuration, in the sensor module, the first and second IC chips are attached to the first support surface and the second support surface orthogonal or tilted with respect to each other of the support member, respectively, and the first and second sensor elements are attached to the one surface sides of the first and second IC chips, respectively.

In this regard, in the sensor module, the principal surfaces of the first and second sensor elements are attached along the one surfaces of the first and second IC chips, and thus, for example, a sensor device corresponding to at least two axes in different directions is provided when housed within one package.

Here, in the sensor module, the first support surface of the support member is provided within the depression, and thus, for example, when the opposite surface to the first support surface in the support member is used as the attachment surface to the external member, the height from the attachment surface to the external member to the first sensor element may be made lower (the profile may be lower) than that in related art configuration of Patent Document 1.

Thereby, the sensor module may contribute to reduction in thickness of the sensor device housing the sensor module.

APPLICATION EXAMPLE 2

In the sensor module according to the above application example, it is preferable that a depth dimension of the depression is larger than a height dimension from the first support surface to the first sensor element.

According to the configuration, in the sensor module, the depth dimension of the depression is larger than the height dimension from the first support surface to the first sensor element.

Therefore, in the sensor module, the height from the attachment surface of the support member to the external member (the opposite surface) to the first sensor element may be made equal to the height of the support member itself.

In this regard, in the sensor module, if the depth dimension of the depression to the first support surface of the support member approximates the height dimension from the first support surface to the first sensor element, reduction of the stiffness of the support member due to provision of the depressed first support surface may be minimized.

Further, in the sensor module, if the depth dimension of the depression to the first support surface of the support member significantly exceeds the height dimension from the first support surface to the sensor element, the height of the sensor module may be maintained equal to the height of the support member itself even in the case where another member is added to the first sensor element or the first IC chip, for example.

APPLICATION EXAMPLE 3

In the sensor module according to the above application example, it is preferable that the support member includes a support member base part having a rectangular parallelepiped shape and a side wall part projecting form the support member base part, the second support surface is provided over the support member base part and the side wall part, a thickness dimension of the support member base part is larger than a thickness dimension of the side wall part in a thickness direction of the second sensor element, the second IC chip has an attachment area to the support member base part larger than an attachment area to the side wall part, and at least a part of the second sensor element overlaps with the support member base part in a side view from a direction orthogonal to the principal surface of the second sensor element.

According to the configuration, in the sensor module, the second support surface of the support member is provided over the support member base part and the side wall part, the thickness dimension of the support member base part is larger than the thickness dimension of the side wall part, the second IC chip has the attachment area to the support member base part larger than the attachment area to the side wall part, and at least a part of the second sensor element overlaps with the support member base part.

Accordingly, in the sensor module, in the support member base part having the larger thickness than that of the side wall part, unwanted vibration is hard to be generated even when a mechanical impact from the outside is applied thereto, and thus, an adverse effect on the second sensor element attached to the second IC chip, which has the larger attachment area to the support member base part, may be reduced.

APPLICATION EXAMPLE 4

In the sensor module according to the above application example, it is preferable that at least one of the first and second IC chips has an external connection terminal on the one surface side, and a flexible wiring board is attached to the external connection terminal.

According to the configuration, in the sensor module, at least one of the first and second IC chips has the external connection terminal on the one surface side and the flexible wiring board is attached to the external connection terminal, and thus, the flexible wiring board may be bent into a partially horizontal state regardless of the positions of the IC chips.

Accordingly, the sensor module may easily be connected to an external member such as a package, for example, via the flexible wiring board in the horizontal state.

APPLICATION EXAMPLE 5

In the sensor module according to Application Example 4, it is preferable that a reinforcing part for improvement of stiffness of the flexible wiring board is provided on an opposite surface to the first and second IC chips side of the flexible wiring board in a range from an attachment region to the external connection terminal beyond ends of the first and second IC chips in a plan view.

According to the configuration, in the sensor module, the reinforcing part for improvement of stiffness of the flexible wiring board is provided on the opposite surface to the first and second IC chips side of the flexible wiring board in the range from the attachment region to the external connection terminal of the first and second IC chips beyond the ends of the first and second IC chips in the plan view.

Thereby, in the sensor module, the stiffness is improved over the range from the attachment region to the external connection terminals of the first and second IC chips beyond the ends of the first and second IC chips in the flexible wiring board.

Accordingly, when the sensor module is attached to an external member such as a package, for example, a wiring pattern is hard to be in contact with the ends of the first and second IC chips due to bending of the flexible wiring board, and short circuit between the flexible wiring board and the first and second IC chips may be avoided.

APPLICATION EXAMPLE 6

In the sensor module according to Application Example 5, it is preferable that the reinforcing part of the flexible wiring board contains a metal.

According to the configuration, in the sensor module, the reinforcing part of the flexible wiring board contains a metal, and thus, may be formed by leaving a part of a metallic coating (a copper foil, for example) for wiring of the flexible wiring board in the range, for example.

Accordingly, in the sensor module, the reinforcing part of the flexible wiring board may rationally be provided.

APPLICATION EXAMPLE 7

In the sensor module according to the above application example, it is preferable that the first and second connection terminals of the first and second IC chips are projection electrodes projecting toward the one surface sides.

According to the configuration, in the sensor module, the connection terminals of the first and second IC chips are projection electrodes projecting toward the one surface sides, and thus, gaps may be provided between the first and second sensor elements and the first and second IC chips, and contact between the first and second sensor elements and the first and second IC chips may be avoided.

Thereby, in the sensor module, stable driving of the first and second sensor elements may be performed.

APPLICATION EXAMPLE 8

In the sensor module according to the above application example, it is preferable that a recessed part is provided above at least one of the first support surface and the second support surface.

According to the configuration, in the sensor module, a recessed part is provided on at least one of the first support surface and the second support surface, and thus, by providing at least one of the first and second IC chips in the recessed part, at least one of the first and second IC chips may accurately be attached to a predetermined position of each surface.

APPLICATION EXAMPLE 9

This application example is directed to a sensor device including the sensor module according to any one of the above application examples and a package that houses the sensor module, wherein the sensor module is housed within the package.

According to the configuration, in the sensor device, the sensor module according to any one of the application examples is housed within the package, and thus, the sensor device having the advantage described in any one of the application examples may be provided.

APPLICATION EXAMPLE 10

This application example is directed to an electronic apparatus including the sensor module according to any one of the above application examples.

According to the configuration, the electronic apparatus includes the sensor module according to any one of the application examples, and thus, the electronic apparatus having the advantage described in any one of the application examples may be provided.

APPLICATION EXAMPLE 11

This application example is directed to a manufacturing method of a sensor device including preparing a support member having a first support surface provided in parallel to a first reference plane within a depression and a second support surface in parallel to a second reference plane orthogonal or tilted with respect to the first reference plane, preparing a first IC chip having a first connection terminal and an external connection terminal on one surface side, the other surface side along the one surface being an attachment surface to the first support surface, and a second IC chip having a second connection terminal and an external connection terminal on one surface side, the other surface side along the one surface being an attachment surface to the second support surface, preparing a first sensor element having a first connection electrode and a second sensor element having a second connection electrode, preparing plural flexible wiring boards with a reinforcing part for improvement of stiffness provided above an opposite surface to the first and second IC chips side of at least one of the flexible wiring boards in ranges from attachment regions to the external connection terminals of the first and second IC chips beyond ends of the first and second IC chips in a plan view, preparing a package that houses the respective component elements, attaching the flexible wiring boards respectively to the external connection terminals of the first and second IC chips, providing the first and second sensor elements above the one surface sides of the first and second IC chips, and attaching the first and second connection electrodes of the first and second sensor elements to the first and second connection terminals of the first and second IC chips so that principal surfaces of the first and second sensor elements may be along the one surfaces or the other surfaces, performing adjustment and characteristic inspection of the first and second sensor elements and the first and second IC chips via the flexible wiring boards, of plural sensor units respectively including the first and second IC chips to which the first and second sensor elements and the flexible wiring boards have been attached, attaching a second sensor unit including the second IC chip to the second support surface of the support member on the other surface side of the second IC chip, attaching an opposite surface to the first support surface of the support member, to which the second sensor unit has been attached, to a support member bonding surface of the package, attaching the first sensor unit including the first IC chip, to which the flexible wiring board having the reinforcing part has been attached, to the first support surface of the support member that has been attached to the support member bonding surface of the package on the other surface side of the first IC chip, and attaching the flexible wiring boards of the first and the second sensor units to the support member bonding surface of the package.

According to the configuration, the manufacturing method of the sensor device may manufacture and provide the sensor device having the advantage described in the application example 9.

Further, in the manufacturing method of the sensor device, the second sensor unit is first attached to the second support surface of the support member.

Thereby, in the manufacturing method of the sensor device, the first support surface of the support member along the support member bonding surface of the package, to which the first sensor unit will be attached later, may be held using a suction unit or the like, for example, and handling of the support member becomes easier.

Accordingly, the manufacturing method of the sensor device may improve productivity because attachment of the support member to the package becomes easier.

BRIEF DESCRIPTION OF THE DRAWINGS

The invention will be described with reference to the accompanying drawings, wherein like numbers reference like elements.

FIG. 1A is a plan view and FIG. 1B is a side view as seen from a direction of arrow A in FIG. 1A.

FIG. 9A is a plan view and FIG. 9B is a side view as seen from a direction of arrow A in FIG. 9A.

FIG. 10A is a plan downward view from a lid side and FIG. 10B is a sectional view along J-J line in FIG. 10A.

FIG. 13A is a plan view and FIG. 13B is a side view.

FIG. 14A is a plan view and FIG. 14B is a side view.

FIG. 15A is a plan view and FIG. 15B is a side view as seen from a direction of arrow K in FIG. 15A.

FIG. 16A is a plan view and FIG. 16B is a sectional view along M-M line in FIG. 16A.

FIG. 17A is a plan view and FIG. 17B is a sectional view along N-N line in FIG. 17A.

DESCRIPTION OF EXEMPLARY EMBODIMENTS

As below, embodiments as implementation of the invention will be explained with reference to the drawings.

First Embodiment

Figure 1A:
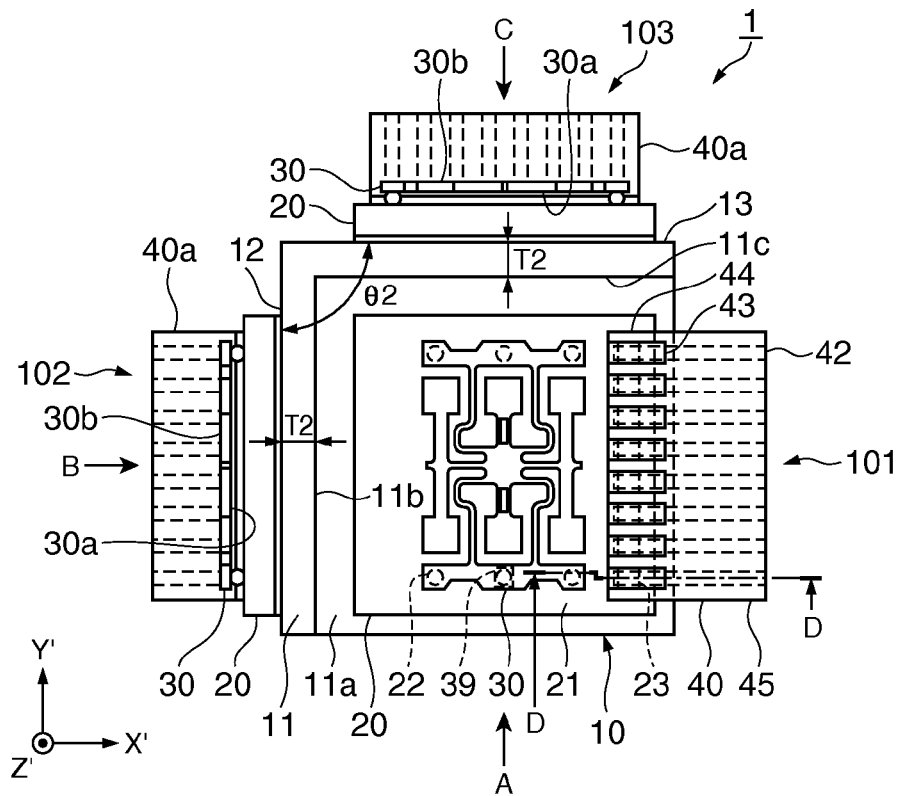
FIGS. 1A and 1B are diagrams showing a schematic configuration of a sensor module of the first embodiment.
Figure 1B:
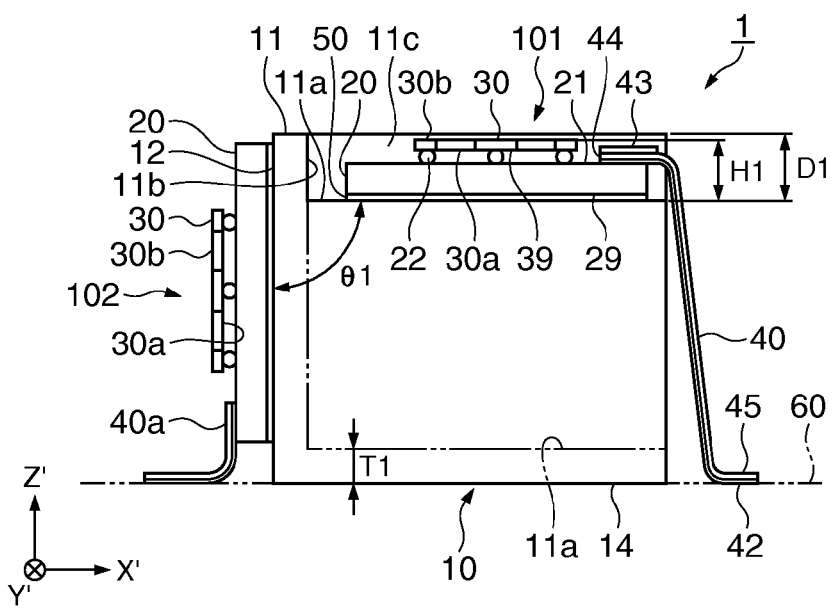
Figure 2A:
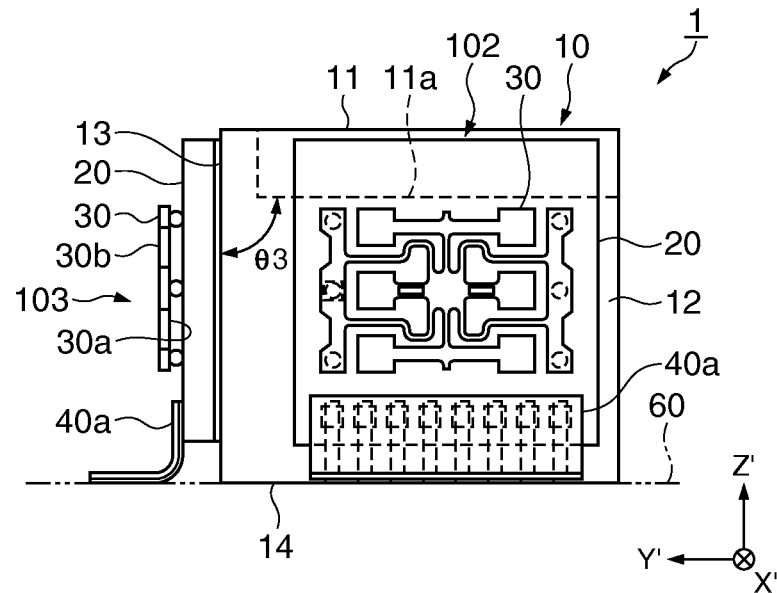
FIG. 2A is a side view as seen from a direction of arrow B in FIG. 1A
Figure 2B:
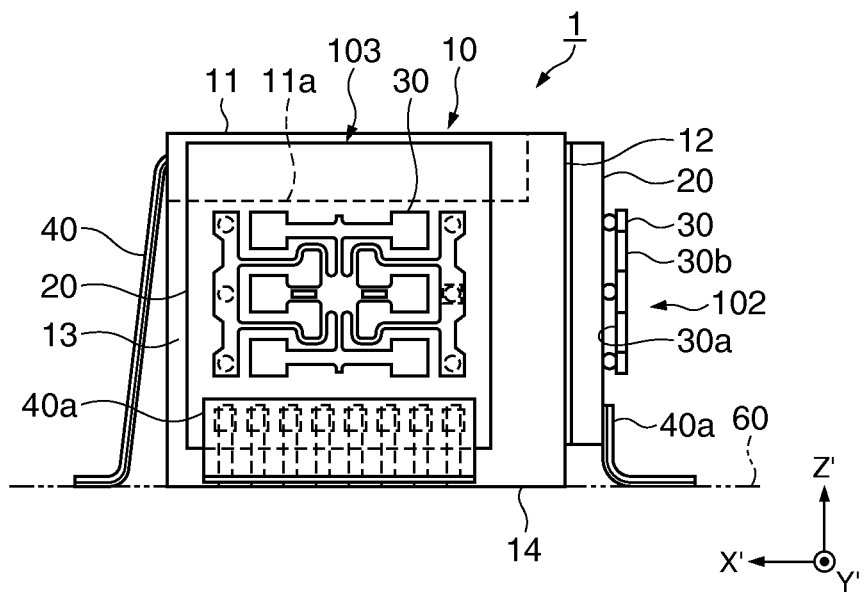
FIG. 2B is a side view as seen from a direction of arrow C in FIG. 1A.

FIGS. 1A, 1B, 2A, and 2B are diagrams showing a schematic configuration of a sensor module of the first embodiment. FIG. 1A is a plan view and FIG. 1B is a side view as seen from a direction of arrow A in FIG. 1A. FIG. 2A is a side view as seen from a direction of arrow B in FIG. 1A and FIG. 2B is a side view as seen from a direction of arrow C in FIG. 1A.

Figure 3:
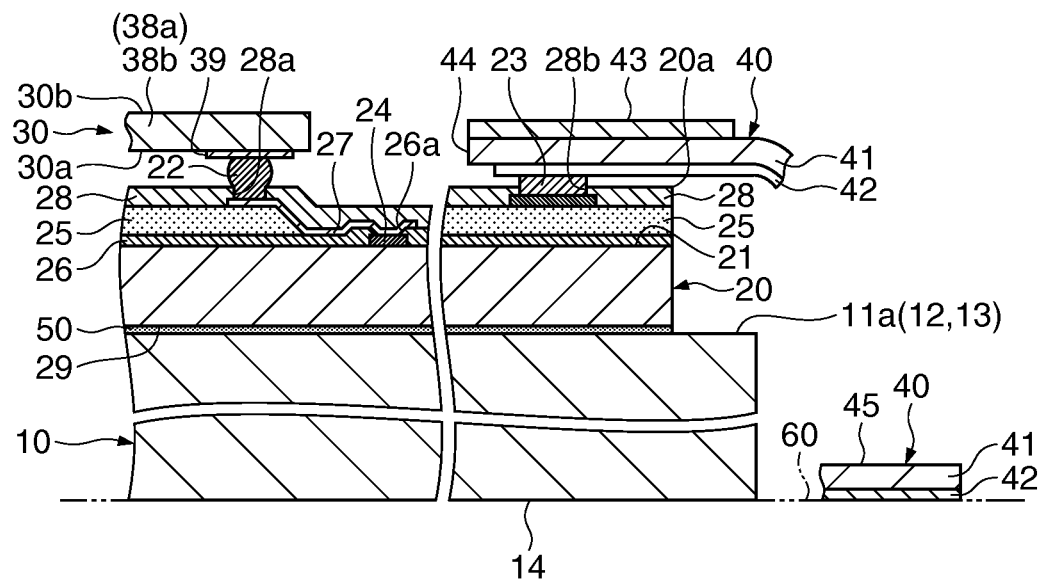
FIG. 3 is a sectional view along D-D line in FIG. 1A.
Figure 4:
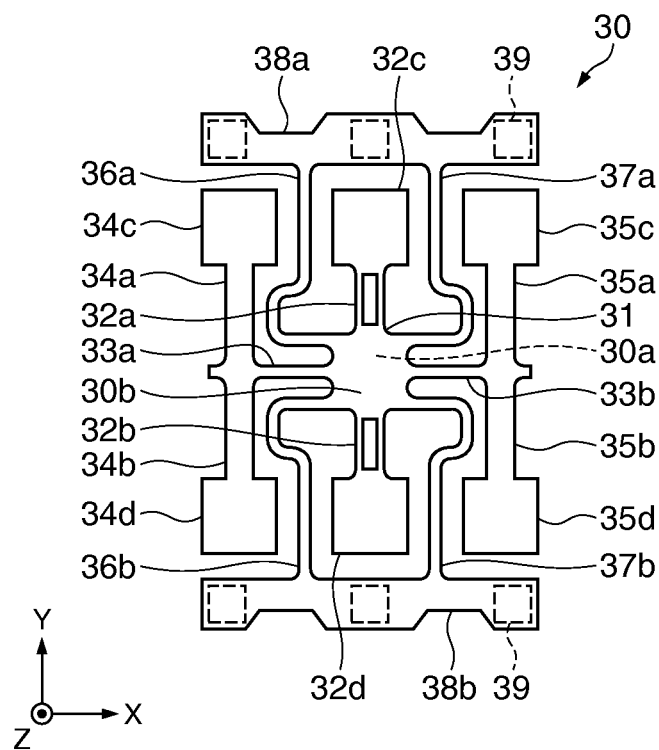
FIG. 4 is an enlarged plan view of a sensor element.

FIG. 3 is a sectional view along D-D line in FIG. 1A, and FIG. 4 is an enlarged plan view of a sensor element. Note that the dimension ratios of the respective component elements in the respective drawings including the following drawings are different from reality.

As shown in FIGS. 1A to 2B, the sensor module 1 includes a support member 10, three IC chips 20, three vibration gyro elements (gyro vibrating reeds) 30 as sensor elements, and two types of flexible wiring boards 40, 40a.

The support member 10 has a nearly rectangular parallelepiped shape, and has a first flat surface 11, a second flat surface 12 orthogonally connected to the first flat surface 11, a third flat surface 13 orthogonally connected to the first flat surface 11 and the second flat surface 12, and a fourth flat surface 14 opposed to the first flat surface 11 as an attachment surface to an external member.

Further, the support member 10 has a support surface 11a as a first support surface depressed from the first flat surface 11 and provided in parallel to a first reference plane (not shown) within a depression. Specifically, the support surface 11a is a flat surface formed when a rectangular region slightly separated from the second flat surface 12 and the third flat surface 13 in the first flat surface 11 is depressed (shifted) in parallel to the fourth flat surface 14 side with respect to the first flat surface 11.

Here, the second flat surface 12 corresponds to a second support surface in parallel to a second reference plane (not shown) orthogonal or tilted with respect to the first reference plane.

The support surface 11a is connected to the first flat surface 11 by a side surface 11b opposed to the second flat surface 12 and a side surface 11c opposed to the third flat surface 13. Note that the side surfaces 11b, 11c are connected to each other.

Thereby, in the support member 10, L-shaped side wall parts in a plan view projecting from the support surface 11a toward the first flat surface 11 are formed.

In other words, the support member 10 includes a support member base part (a part from the support surface 11a to the fourth flat surface 14) having a rectangular parallelepiped shape, a first side wall part having the second flat surface 12 and the side surface 11b and projecting from the support member base part, and a second side wall part having the third flat surface 13 and the side surface 11c and projecting from the support member base part.

Thereby, the second flat surface 12 is provided over the support member base part and the first side wall part, and the third flat surface 13 is provided over the support member base part and the second side wall part.

Note that the respective corners of the support member 10 may be rounded or chamfered, and the member has the rectangular parallelepiped shape even when the respective corners are rounded or chamfered in the embodiment.

As described above, in the support member 10, all of an angle θ1 formed by the support surface 11a (first flat surface 11) and the second flat surface 12, an angle θ2 formed by the second flat surface 12 and the third flat surface 13, and an angle θ3 formed by the support surface 11a (first flat surface 11) and the third flat surface 13 are 90 degrees (right angles). Note that, regarding the angles θ1 to θ3, some margin of error that does not affect the sensing function may be allowed (for example, about 0 to 2 degrees).

Materials of the support member 10 include metals such as structural steel, stainless steel, copper, brass, phosphor bronze, aluminum, nickel, chromium, titanium, and nickel silver (including single metals or their alloys), ceramics such as alumina ceramics, aluminum nitride ceramics, silicon carbide ceramics, silicon nitride ceramics, glass ceramics, and mullite ceramics, thermoset or ultraviolet curable resins such as epoxy resins, polyimide resins, acrylic resins, phenol resins, and polyester resins, compound materials of inorganic materials such as ceramics and resins, etc.

Note that, in consideration of short circuit to the flexible wiring board 40, the materials having insulation properties such as ceramics and resins are more preferable for the materials of the support member 10.

As shown in FIG. 3, the IC chips 20 as the first and second IC chips have connection terminals 22 as first and second connection terminals and external connection terminals 23 at active surfaces 21 as one surfaces.

Further, the IC chips 20 have inactive surfaces 29 as the other surfaces opposite to the active surfaces 21 along the active surfaces 21 attached to the support surface 11a, the second flat surface 12, and the third flat surface 13 of the support member 10 (hereinafter, simply referred to as "the respective surfaces) in an insulated condition from the support member 10 by an insulating adhesive 50.

Specifically, in the IC chip 20, an integrated circuit (not shown) including semiconductor devices such as a transistor and a memory device is formed on the active surface 21 side. In the integrated circuit, a drive circuit that drive-vibrates the vibration gyro element 30 and a detection circuit that detects detection vibration generated in the vibration gyro element 30 when an angular velocity is applied thereto are provided.

The IC chip 20 includes a first electrode 24 provided on the active surface 21 side, the connection terminal 22 electrically connected to the first electrode 24 and provided on the active surface 21 side, a stress relaxation layer 25 provided between the active surface 21 and the connection terminal 22, and the external connection terminal 23 provided on the active surface 21 side.

The first electrode 24 is formed in direct conduction with the integrated circuit of the IC chip 20. Further, on the active surface 21, a first insulating layer 26 as a passivation film is formed and an opening part 26a is formed on the first electrode 24 in the first insulating layer 26.

According to the configuration, the first electrode 24 is exposed to the outside within the opening part 26a.

On the first insulating layer 26, the stress relaxation layer 25 of an insulating resin is formed in a location where none of the first electrode 24 or the other electrodes is provided.

Further, a wire 27 as a relocation wire is connected to the first electrode 24 within the opening part 26a of the first insulating layer 26. The wire 27 is for relocation of electrodes of the integrated circuit, and formed to be extended from the first electrode 24 located in a predetermined part of the IC chip 20 and routed onto the stress relaxation layer 25.

The wire 27 is generally called a relocation wire because it wires between the first electrode 24 and the connection terminal 22 of the IC chip 20, and an important component element for improvement of the degree of freedom of the connection location to the vibration gyro element 30 in the IC chip 20 by arbitrarily shifting the location of the connection terminal 22 with respect to the first electrode 24 for which the restriction of the location is severe by microstructural design.

Furthermore, on the active surface 21 side of the IC chip 20, a second insulating layer 28 of a resin having heat resistance is formed to cover the wire 27, the stress relaxation layer 25, and the first insulating layer 26. Note that the second insulating layer 28 includes a solder resist.

An opening part 28a is formed on the wire 27 on the stress relaxation layer 25 in the second insulating layer 28. According to the configuration, part of the wire 27 is exposed to the outside within the opening part 28a.

Further, the connection terminal 22 is provided on the wire 27 exposed within the opening part 28a. The connection terminal 22 is a projection electrode formed in a bump shape using a solder ball, a gold wire, an aluminum wire, or the like, for example. Here, as the connection terminal 22, a bump formed by providing a metal film, a conducting adhesive, or the like on the surface of the resin projection (for example, a resin core bump) may be used. Further, by providing a conducting adhesive or the like on the surface of a metal bump, electrical connection by the connection terminal 22 may be made further reliable.

The integrated circuit having the configuration and formed above the IC chip 20 is electrically connected to the vibration gyro element 30 via the first electrode 24, the wire 27, and the connection terminal 22.

In this regard, in the sensor module 1, a sufficient gap is provided between the vibration gyro element 30 and the IC chip 20 because the connection terminal 22 is the projection electrode. By the gap, in the sensor module 1, a space for drive vibration and detection vibration of the vibration gyro element 30 is secured.

Further, in the integrated circuit formed in the IC chip 20, other electrodes (not shown) than the first electrode 24 are formed. Relocation wires are connected to the other electrodes as is the case of the first electrode 24, and connected to the external connection terminal 23 exposed to the outside within an opening part 28b of the second insulating layer 28.

The external connection terminal 23 is a projection electrode formed in a bump shape using a solder ball, a gold wire, an aluminum wire, or the like, for example, so that the flexible wiring boards 40, 40a may be attached thereto.

The first electrode 24, the other electrodes, and the relocation wires such as the wire 27 are formed by gold (Au), copper (Cu), silver (Ag), titanium (Ti), tungsten (W), titanium tungsten (TiW), titanium nitride (TiN), nickel (Ni), nickel vanadium (NiV), chromium (Cr), aluminum (Al), palladium (Pd), or the like.

Note that, as the relocation wires such as the wire 27, not only single-layer structures of the above materials, but laminated structures in combination of the plural kinds of the above materials may be employed. The relocation wires such as the wire 27 are made of the same materials with one another because they are generally formed in the same process.

Further, as resins for formation of the first insulating layer 26 and the second insulating layer 28, for example, polyimide resins, silicone-modified polyimide resins, epoxy resins, silicon-modified epoxy resins, acrylic resins, phenol resins, BCB (benzocyclobutene), and PBO (polybenzoxazole), or the like are used.

Note that the first insulating layer 26 may be formed using an inorganic insulating material of silicon oxide ($SiO_2$), silicon nitride ($Si_3N_4$), or the like.

The inactive surfaces 29 of the IC chips 20 are attached to the respective surfaces 11a, 12, 13 of the support member 10 using an insulating adhesive 50 containing polyimide, epoxy, silicone, or the like under the insulated condition.

Note that, in some other drawings than FIG. 3, the active surface 21 is indicated in the second insulating layer 28 of the IC chip 20 for convenience.

As shown in FIG. 4, the vibration gyro elements 30 as the first and second sensor elements (hereinafter, simply referred to as "sensor elements") are formed using a piezoelectric material of quartz as a base material (a material forming main parts). The quartz has the X-axis called the electrical axis, the Y-axis called the mechanical axis, and the Z-axis called the optical axis.

Further, the vibration gyro element 30 is cutout along the plane defined by the orthogonal X-axis and Y-axis in the quartz crystal axis and processed in a flat plate shape, and has a predetermined thickness in the Z-axis direction orthogonal to the plane. Note that the predetermined thickness is appropriately set according to an oscillation frequency, (resonance frequency), an outer size, processability, or the like.

Furthermore, the flat plate forming the vibration gyro element 30 allows the errors of the cutout angles from the quartz in some range with respect to the respective X-axis, Y-axis, and Z-axis. For example, the flat plate rotated in a range from 0 to 7 degrees around the X-axis and cut out may be used. The condition is applied to the Y-axis and the Z-axis.

The vibration gyro element 30 is formed by etching (wet etching or dry etching) using a photolithography technology. Note that plural vibration gyro elements 30 can be cut out from one quartz wafer.

The vibration gyro element 30 has a configuration called the double T-shape.

The vibration gyro element 30 includes a base part 31 located at the center, a pair of detection vibrating arms 32a, 32b as vibrating parts extending from the base part 31 along the Y-axis, a pair of connecting arms 33a, 33b extending from the base part 31 along the X-axis orthogonally to the detection vibrating arms 32a, 32b, and respective pairs of drive vibrating arms 34a, 34b, 35a, 35b as vibrating parts extending from the ends of the respective connecting arms 33a, 33b along the Y-axis nearly in parallel to the detection vibrating arms 32a, 32b.

Further, the vibration gyro element 30 includes supporting arms 36a, 36b, 37a, 37b passing between the respective vibrating arms (for example, between the detection vibrating arm 32a and the drive vibrating arm 34a) and extending generally along the Y-axis from the base part 31, a supporting part 38a provided over the ends of the supporting arms 36a, 37a extending in the same direction, and a supporting part 38b provided over the ends of the supporting arms 36b, 37b extending in the same direction.

The supporting parts 38a, 38b extend along the pair of connecting arms 33a, 33b over the ends of the respective vibrating arms.

The supporting arms 36a, 36b, 37a, 37b have a function of absorbing a mechanical impact that causes erroneous detection. Specifically, the supporting arms 36a, 36b, 37a, 37b have a function of absorbing a mechanical impact by deformation such as bowing or bending when the mechanical impact causing erroneous detection is applied to the vibration gyro element 30.

Thereby, the vibration gyro element 30 may prevent the mechanical impact causing erroneous detection from transmitting to the drive vibrating arms 34a, 34b, 35a, 35b and the detection vibrating arms 32a, 32b.

Further, in the vibration gyro element 30, detection electrodes (not shown) are formed on the detection vibrating arms 32a, 32b, and drive electrodes (not shown) are formed on the drive vibrating arms 34a, 34b, 35a, 35b.

The vibration gyro element 30 forms a detection vibration system that detects an angular velocity using the detection vibrating arms 32a, 32b, and forms a drive vibration system that drives the vibration gyro element 30 using the connecting arms 33a, 33b and the drive vibrating arms 34a, 34b, 35a, 35b.

Furthermore, weight parts 32c, 32d are formed on the respective ends of the detection vibrating arms 32a, 32b, and weight parts 34c, 34d, 35c, 35d are formed on the respective ends of the drive vibrating arms 34a, 34b, 35a, 35b.

Thereby, the vibration gyro element 30 is downsized and improved in detection sensitivity of the angular velocity.

The vibration gyro element 30 is provided on the active surface 21 side of the IC chip 20 to overlap with the IC chip 20 in a plan view.

Note that the vibration gyro element 30 uses the front and rear surfaces of the flat plate including the base part 31, the respective vibrating arms, and the respecting supporting parts as principal surfaces. In the embodiment, the surface electrically connected to the outside is referred to as "one principal surface 30a" and the surface opposed to the one principal surface 30a (the opposite surface) is referred to as "other principal surface 30b".

On the one principal surface 30a of the supporting parts 38a, 38b of the vibration gyro element 30, six connection electrodes 39 as first and second connection electrodes led out from the respective detection electrodes and the drive electrodes are provided.

As shown in FIG. 3, in the vibration gyro element 30, the respective connection electrodes 39 are attached (electrically and mechanically connected) to the respective connection terminals 22 of the IC chip 20 so that the one principal surface 30a (the other principal surface 30b) may be along (in parallel to) the respective surfaces 11a, 12, 13 of the support member 10.

In other words, in the vibration gyro element 30, the respective connection electrodes 39 are attached (electrically and mechanically connected) to the respective connection terminals 22 of the IC chip 20 so that the one principal surface 30a (the other principal surface 30b) may be along the active surface 21 or the inactive surface 29 of the IC chip 20.

Here, operation of the vibration gyro element 30 of the sensor module 1 will be explained.

Figure 5:
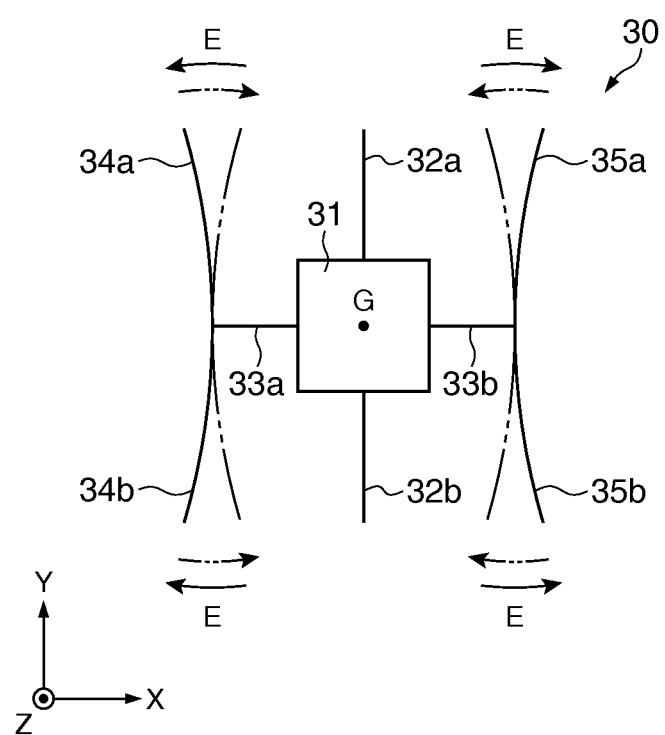
FIG. 5 is a schematic plan view for explanation of operation of a vibration gyro element.
Figure 6A:
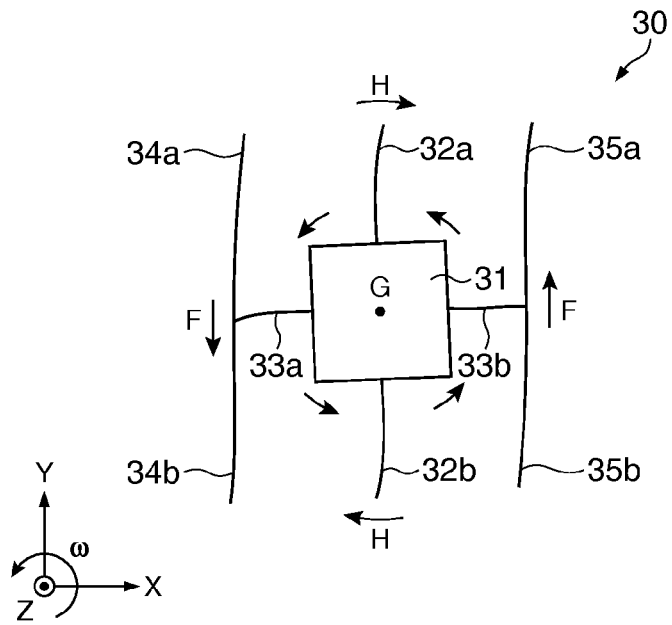
FIGS. 6A and 6B are schematic plan views showing detection vibration states of the vibration gyro element.
Figure 6B:
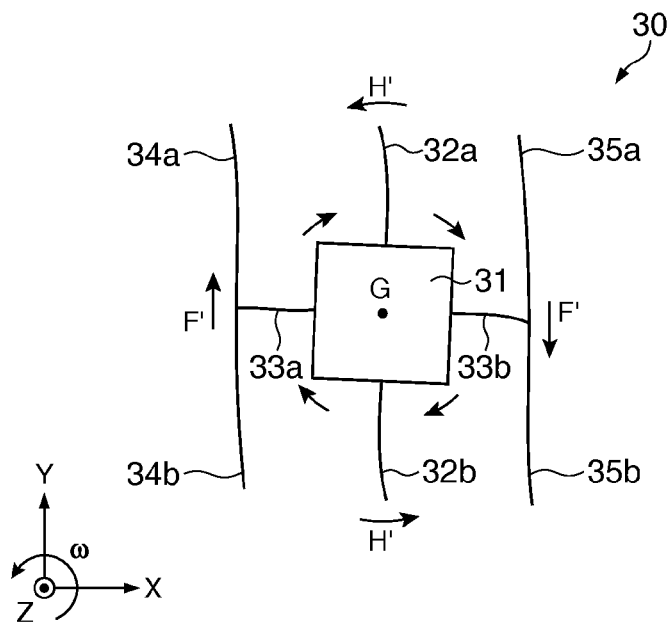

FIGS. 5, 6A, and 6B are schematic plan view for explanation of operation of the vibration gyro element. FIG. 5 shows a drive vibration state, and FIGS. 6A and 6B show a detection vibration state under a condition that an angular velocity is applied.

Note that, in FIGS. 5 to 6B, for simple depiction of the vibration states, the respective vibrating arms are shown by lines and the respective supporting arms and the respective supporting parts are omitted.

In FIG. 5, the drive vibration state of the vibration gyro element 30 will be explained.

First, when a drive signal is applied from the integrated circuit (drive circuit) of the IC chip 20, the drive vibrating arms 34a, 34b, 35a, 35b perform flexural vibration in directions shown by arrows E under a condition that no angular velocity is applied to the vibration gyro element 30. The flexural vibration repeats a vibration mode shown by solid lines and a vibration mode shown by chain double-dashed lines at a predetermined frequency.

Next, when an angular velocity W around the Z-axis is applied to the vibration gyro element 30 during the drive vibration, the vibration gyro element 30 performs vibration as shown in FIGS. 6A and 6B.

First, as shown in FIG. 6A, Coriolis forces in directions of arrows F act on the drive vibrating arms 34a, 34b, 35a, 35b and the connecting arms 33a, 33b forming the drive vibration system. Further, simultaneously, the detection vibrating arms 32a, 32b deform in directions of arrows H in response to the Coriolis forces in the directions of arrows F.

Then, as shown in FIG. 6B, forces returning in direction of arrows F' act on the drive vibrating arms 34a, 34b, 35a, 35b and the connecting arms 33a, 33b. Further, simultaneously, the detection vibrating arms 32a, 32b deform in directions of arrows H' in response to the forces in the directions of arrows F'.

The vibration gyro element 30 alternately repeats the series of operation, and thereby, new vibration is excited.

Note that the vibration in the directions of arrows F, F' is vibration in a circumferential direction with respect to the center of gravity G. Further, in the vibration gyro element 30, the angular velocity ω around the Z-axis is obtained because the detection electrodes formed on the detection vibrating arms 32a, 32b detect distortion of the quartz generated due to vibration.

Returning to FIG. 3, the flexible wiring board 40 includes a base layer 41 mainly containing a resin having flexibility such as polyimide, for example, and a wiring pattern layer 42 bonded to the base layer 41 and mainly containing a copper foil patterned in a desired shape.

Further, in the flexible wiring board 40, reinforcing layers 43 as reinforcing parts for improvement of the stiffness of the flexible wiring board 40 are provided on the opposite surface to the active surface 21 side of the IC chip 20 in the base layer 41 over a range from the attachment region to the external connection terminal 23 of the IC chip 20 beyond the end 20a of the IC chip 20.

The reinforcing layers 43 are individually provided in rectangular island shapes in locations corresponding to (opposed to) the respective wiring patterns of the wiring pattern layer 42.

The reinforcing layer 43 includes a metallic coating (metal) mainly containing a copper foil like the wiring pattern layer 42.

That is, the reinforcing layer 43 may be provided by leaving a metallic coating on one surface of the double-sided flexible wiring board having metallic coatings on both sides (for example, copper foils) in the above described desired shape.

As described above, the flexible wiring board 40 has a laminated structure including the base layer 41, the wiring pattern layer 42, and the reinforcing layers 43.

In the flexible wiring board 40, the wiring pattern layer 42 at one end 44 side is attached (bonded) to the external connection terminal 23 of the IC chip 20.

Note that the flexible wiring board 40a corresponds to the flexible wiring board 40 without the reinforcing layer 43.

The flexible wiring boards 40, 40a have flexibility and may freely be bent in response to the degrees of flexibility.

Thereby, as shown in FIGS. 1A to 3, the flexible wiring boards 40, 40a may be bent at the middle to conform a stage 60 (external member) on which the support member 10 is placed with the fourth flat surface 14 as the placement surface regardless of the position of the IC chip 20.

In this regard, since the flexible wiring board 40 includes the reinforcing layers 43, stiffness of this part is improved and, as shown in FIG. 3, the wiring pattern layer 42 and the end 20a of the IC chip 20 are hard to contact when the board is bent toward the inactive surface 29 side of the IC chip 20.

It is preferable to form the reinforcing layers 43 provided in the flexible wiring board 40 using a material having a Young's modulus larger than that of the material of the base material 41 of the flexible wiring board 40. Thereby, the reinforcing layers 43 may suppress the deflection of the flexible wiring board 40 toward the IC chip 20 side more effectively.

Note that the flexible wiring boards 40, 40a may be formed so that the pitch between the wiring patterns of the wiring pattern layer 42 may be wider at the other end 45 side than that at the IC chip 20 (one end 44) side.

Further, the flexible wiring boards 40, 40a may include a protective layer that partially covers the wiring pattern layer 42 and insulates and protects the wiring pattern layer 42 from the outside.

In the embodiment, the unit in which the vibration gyro element 30 and the flexible wiring boards 40, 40a are attached to the IC chip 20 is referred to as "sensor unit".

In other words, the sensor unit includes the IC chip 20 to which the vibration gyro element 30 and the flexible wiring boards 40, 40a are attached.

Further, the first sensor unit attached to the support surface 11a of the support member 10 is indicated by a sensor unit 101, the second sensor unit attached to the second flat plate 12 is indicated by a sensor unit 102, and the third sensor unit attached to the third flat plate 13 is indicated by a sensor unit 103.

Further, in the embodiment, the IC chip 20 of the sensor unit 101 corresponds to a first IC chip and the IC chip 20 of the sensor unit 102 corresponds to a second IC chip, and the vibration gyro element 30 of the sensor unit 101 corresponds to a first sensor element and the vibration gyro element 30 of the sensor unit 102 corresponds to a second sensor element.

Furthermore, the connection terminal 22 of the IC chip 20 of the sensor unit 101 corresponds to a first connection terminal and the connection terminal 22 of the IC chip 20 of the sensor unit 102 corresponds to a second connection terminal, and the connection electrode 39 of the vibration gyro element 30 of the sensor unit 101 corresponds to a first connection electrode and the connection electrode 39 of the vibration gyro element 30 of the sensor unit 102 corresponds to a second connection electrode.

Note that the flexible wiring board 40 is used for the sensor unit 101 and the flexible wiring board 40a is used for the sensor unit 102 and the sensor unit 103.

Returning to FIGS. 1A to 2B, the X'-axis, Y'-axis, and the Z'-axis are axes orthogonal to one another. Further, the support surface 11a of the support member 10 is orthogonal to the Z'-axis, the second flat surface 12 is orthogonal to the X'-axis, and the third flat surface 13 is orthogonal to the Y'-axis.

Thereby, in the sensor unit 101 attached to the support surface 11a, the one principal surface 30a (the other principal surface 30b) of the vibration gyro element 30 is orthogonal to the Z'-axis, and thus, the unit may detect the angular velocity with respect to the Z'-axis (the angular velocity around the Z'-axis).

Similarly, in the sensor unit 102 attached to the second flat surface 12, the one principal surface 30a (the other principal surface 30b) of the vibration gyro element 30 is orthogonal to the X'-axis, and thus, the unit may detect the angular velocity with respect to the X'-axis (the angular velocity around the X'-axis).

Further, similarly, in the sensor unit 103 attached to the third flat surface 13, the one principal surface 30a (the other principal surface 30b) of the vibration gyro element 30 is orthogonal to the Y'-axis, and thus, the unit may detect the angular velocity with respect to the Y'-axis (the angular velocity around the Y'-axis).

Therefore, the sensor module 1 including the sensor units 101, 102, 103 may detect the angular velocities with respect to the three axes of the X'-axis, the Y'-axis, and the Z'-axis orthogonal to one another (the angular velocities around the three axes).

Here, as shown in FIG. 1B, in the sensor module 1, the depth dimension D1 from the first flat surface 11 to the support surface 11a of the support member 10 is larger than the height dimension H1 from the support surface 11a to the vibration gyro element 30 attached to the support surface 11a via the IC chip 20 in the sensor unit 101 (D1>H1).

Further, in the sensor module 1, the bonding area to the support member base part is larger than the bonding area as the attachment area to the first side wall part of the support member 10 in the IC chip 20 as the second IC chip of the sensor unit 102. Note that this is preferably the same with the sensor unit 103.

Furthermore, in the sensor module 1, in the side view from the direction orthogonal to the one principal surface 30a of the vibration gyro element 30 as the second sensor element of the sensor unit 102, it is preferable that at least a part of the vibration gyro element 30 of the sensor unit 102 overlaps with the support member base part, and it is more preferable that the center of the vibration gyro element 30 of the sensor unit 102 (the center in the direction in parallel to the one principal surface 30a of the vibration gyro element 30) overlaps with the support member base part. Note that this is preferably the same with the sensor unit 103.

Thereby, in the sensor module 1, of the support member 10, in the support member base part having a larger thickness than that of the first side wall part, unwanted vibration is hard to be generated even when a mechanical impact from the outside is applied thereto. Accordingly, in the sensor module 1, by providing a part (preferably, most) of the vibration gyro element 30 of the sensor unit 102 to overlap with the support member base part, unwanted vibration transmitted to the vibration gyro element 30 when a mechanical impact from the outside is applied thereto may be reduced. Note that, if the sensor unit 103 has the same configuration, the same advantage may be obtained.

As described above, in the sensor module 1 of the first embodiment, the IC chips 20 are attached to the support surface 11a, the second flat surface 12, and the third flat surface 13 orthogonal to one another of the support member 10, and the vibration gyro elements 30 are attached to the active surface 21 sides of the IC chips 20.

In this regard, in the sensor module 1, the one principal surfaces 30a (other principal surfaces 30b) of the vibration gyro elements 30 are attached along the respective surfaces 11a, 12, 13 to which the IC chips 20 are attached, and thus, the one principal surfaces 30a (other principal surfaces 30b) of the vibration gyro elements 30 are orthogonal to one another.

Therefore, the sensor module 1 may provide a sensor device corresponding to three axes when housed within one package, for example.

Here, in the sensor module 1, since the support surface 11a of the first flat surface of the support member 10 is depressed (recessed) from the first flat surface 11, the height from the fourth flat surface 14 as the attachment surface to the external member such as a package to the vibration gyro element 30 of the sensor unit 101 attached to the support surface 11a may be made lower (the profile may be lower) than that in related art configuration of Patent Document 1.

Thereby, the sensor module 1 may contribute to reduction in the thickness of the sensor device housing the sensor module 1.

In addition, in the sensor module 1, since the support member 10 is nearly in the rectangular parallelepiped shape and the first flat surface 11, the second flat surface 12, and the third flat surface 13 are connected to one another, the stiffness of the support member 10 is significantly stronger than the above described configuration of the bent and raised flat plate, and, for example, the first flat surface (containing the support surface 11a), the second flat surface 12, and the third flat surface 13 do not easily vibrate (displace) due to external force.

As a result, in the sensor module 1, deterioration of the detection characteristics such as detection accuracy and detection sensitivity of the respective vibration gyro elements 30 and IC chips 20 due to external force acting on the support member 10 may be suppressed.

Thereby, the sensor module 1 may contribute to reduction in thickness of the sensor device housing the sensor module 1 while suppressing the deterioration of the detection characteristics such as detection accuracy and detection sensitivity of the respective vibration gyro elements 30 and IC chips 20.

Further, in the sensor module 1, the depth dimension D1 from the first flat surface 11 to the support surface 11a of the support member 10 is larger than the height dimension H1 from the support surface 11a to the vibration gyro element 30 of the sensor unit 101 (D1>H1).

Therefore, in the sensor module 1, the height from the fourth flat surface 14 of the support member 10 to the vibration gyro element 30 of the sensor unit 101 may be made equal to the height from the fourth flat surface 14 to the first flat surface 11 of the support member 10, i.e., the height of the support member 10 itself.

In this regard, in the sensor module 1, if the depth dimension D1 from the first flat surface 11 to the support surface 11a of the support member 10 approximates the height dimension H1 from the support surface 11a to the vibration gyro element 30 of the sensor unit 101, reduction of the stiffness of the support member 10 (specifically, the wall parts provided with the side surfaces 11b, 11c) due to provision of the depressed support surface 11a on the first flat surface 11 may be minimized.

Further, in the sensor module 1, if the depth dimension D1 from the first flat surface 11 to the support surface 11a of the support member 10 significantly exceeds the height dimension H1 from the support surface 11a to the vibration gyro element 30 of the sensor unit 101, the height of the sensor module 1 may be maintained equal to the height of the support member 10 itself even in the case where another member is added to the vibration gyro element 30 or the IC chip 20 of the sensor unit 101 and the height of the sensor unit 101 becomes higher, for example.

Note that, as shown by chain double-dashed lines in FIG. 1B, in the sensor module 1, for example, even when the thickness T1 from the support surface 11a to the fourth flat surface 14 is equal to the thickness T2 from the second flat surface 12 to the side surface 11b and from the third flat surface 13 to the side surface 11c (in other words, when the shape approximates the shape of the above described configuration of the bent and raised flat plate), because the first flat surface 11 to the third flat surface 13 are connected to one another, the stiffness becomes stronger than that of the above described configuration of the bent and raised flat plate.

Further, in the sensor module 1, since the flexible wiring boards 40, 40a have flexibility, the flexible wiring boards 40, 40a may be bent into partially horizontal states regardless of the positions of the respective IC chips 20.

Therefore, the sensor module 1 may easily be attached to an external member such as a package and may easily perform characteristic inspection of the IC chips 20 and the vibration gyro elements 30 via the flexible wiring boards 40, 40a in a horizontal state.

As a result, productivity of the sensor module 1 may be improved.

Further, the sensor module 1 may be formed so that the pitches between the wiring patterns of the wiring pattern layers 42 of the flexible wiring boards 40, 40a may be wider at the other end 45 sides than those at the IC chip 20 (one end 44) sides.

Therefore, the sensor module 1 may easily perform adjustment and characteristic inspection of the IC chips 20 and the vibration gyro elements 30 by bringing a probe into contact with the wiring pattern layers 42 and may be easily attached to an external member such as a package.

As a result, productivity of the sensor module 1 may be improved.

Furthermore, in the sensor module 1, the flexible wiring board 40 is attached to the external connection terminal 23 of the IC chip 20 of the sensor unit 101 and the reinforcing layers 43 for improvement of the stiffness are provided on the opposite surface to the IC chip 20 in the flexible wiring board 40 over the range from the attachment region to the external connection terminal 23 of the IC chip 20 beyond the end 20a of the IC chip 20.

Thereby, in the sensor module 1, the stiffness of the flexible wiring board 40 is improved over the range from the attachment region to the external connection terminal 23 of the IC chip 20 beyond the end 20a of the IC chip 20 in the flexible wiring board 40.

Therefore, when the sensor module 1 is attached to an external member such as a package, for example, the flexible wiring board 40 is hard to easily bend (deflect) into contact with the end 20a of the IC chip 20.

As a result, in the sensor module 1, for example, in the case where the active surface 21 is exposed in the end 20a of the IC chip 20 or the like, short circuit between the wiring pattern layer 42 of the flexible wiring board 40 and the IC chip 20 due to contact between the flexible wiring board 40 and the IC chip 20 and short circuit between the wiring patterns of the wiring pattern layer 42 via the IC chip 20 may be avoided.

Further, in the sensor module 1, since the reinforcing layers 43 of the flexible wiring board 40 are metallic coatings, for example, the reinforcing layers 43 may be formed by leaving parts of one metallic coating (copper foil) of the double-sided flexible wiring board in the above described shapes.

According to the configuration, in the sensor module 1, a new separate member is not necessarily prepared, but the reinforcing layers 43 of the flexible wiring board 40 may rationally be provided.

Furthermore, in the sensor module 1, since the connection terminal 22 of the IC chip 20 is the projection electrode projecting to the active surface 21 side, the gap may be provided between the vibration gyro element 30 and the IC chip 20 and contact between the vibration gyro element 30 and the IC chip 20 may be avoided.

Thereby, the sensor module 1 may perform stable driving of the vibration gyro element 30.

Further, in the sensor module 1, even in the case where a conducting material is used for the material of the support member 10 or an insulating material is used as a parent material of the support member 10, unwanted capacitive coupling of the IC chip 20 and the vibration gyro element 30 between the different detection axes may be suppressed by forming a coating of the conducting material on the surface of the support member 10 or otherwise. That is, the sensor module 1 may reduce the unwanted capacitive coupling among the sensor units 101, 102, 103 because of the shield effect of the support member 10.

Figure 7:
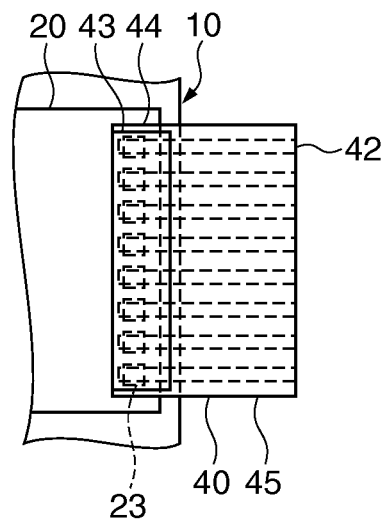
FIG. 7 is an enlarged plan view of a main part of the sensor module.

Note that, in the sensor module 1, as shown in the enlarged sectional view of a main part of the sensor module of FIG. 7, the shapes of the reinforcing layers 43 of the flexible wiring board 40 may be nearly rectangular shapes over between the wiring patterns of the wiring pattern layer 42.

The planar shapes of the reinforcing layers 43 of the flexible wiring board 40 may appropriately be selected from the shapes including the shapes of the embodiment and the like in response to desired stiffness.

Note that, in the sensor module 1, the flexible wiring boards 40 having the reinforcing layers 43 may be used for the sensor units 102, 103 in place of the flexible wiring boards 40a.

According to the configuration, in the sensor module 1, by replacing the flexible wiring boards 40a in the sensor units 102, 103 by the flexible wiring boards 40, short circuit between them due to bending (deflection) toward the IC chip 20 side, which may occur in the flexible wiring board 40a, may be avoided.

Note that, in the sensor module 1, the reinforcing layers 43 of the flexible wiring board 40 may be formed by members including resins containing polyimide, epoxy, or the like, for example.

Figure 8:
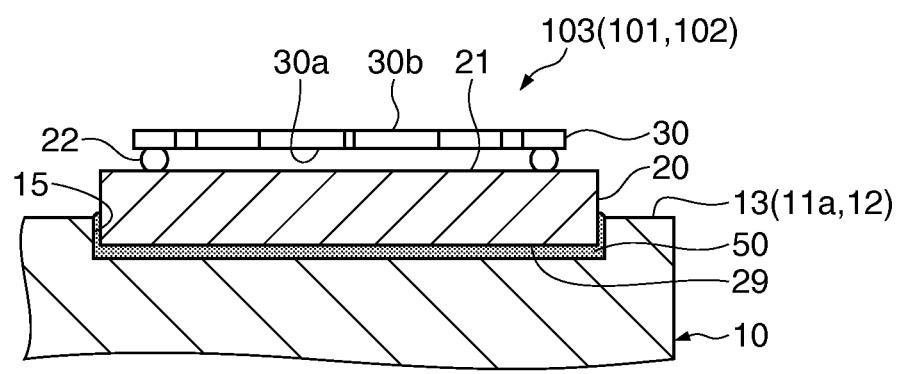
FIG. 8 is an enlarged sectional view of a main part of the sensor module.

Further, in the sensor module 1, recessed parts 15 may be provided on the respective surfaces 11a, 12, 13 of the support member 10 as shown in the enlarged sectional view of a main part of the sensor module of FIG. 8.

According to the configuration, in the sensor module 1, by providing the IC chips 20 in the recessed parts 15, the IC chips 20 may accurately be attached in predetermined locations on the respective surfaces 11a, 12, 13.

Note that it is preferable that the recessed parts 15 have shapes surrounding the entire circumferences of the IC chips 20 in normal line views (plan views) of the respective surfaces 11a, 12, 13, however, shapes that do not surround one sides of the IC chips 20 may be employed.

The sensor module 1 may have a configuration in which the sensor units 101, 103 are removed (in which only the sensor unit 102 is attached). Or, the sensor module 1 may have a configuration in which the sensor units 101, 102 are removed (in which only the sensor unit 103 is attached).

According to the configuration, the sensor module 1 may provide a reliable mounting structure of the sensor element in the sensor device corresponding to one axis, in which the principal surface of the sensor element (vibration gyro element 30) is mounted in a position orthogonal to the bottom surface of the package.

Note that the sensor module 1 may have a configuration in which one of the sensor units 101, 102, 103 is removed and angular velocities with respect to the two axis orthogonal to each other are detected.

Further, the sensor module 1 may have a configuration in which the supporting arms 36a, 36b, 37a, 37b and the supporting parts 38a, 38b of the vibration gyro element 30 are removed by providing six connection electrodes 39 of the vibration gyro element 30 on one principal surface 30a of the base part 31.

According to the configuration, in the sensor module 1, it is not necessary to make the planar size of the IC chip 20 larger than the planar size of the vibration gyro element 30, and thus, the planar size of the IC chip 20 may be made smaller than the planar size of the vibration gyro element 30.

As a result, the sensor module 1 may be further reduced in size and thickness.

Further, the sensor module 1 may have a configuration in which the respective surfaces 11a, 12, 13 are not orthogonal to one another and the angles θ1, θ2, θ3 are acute angles or obtuse angles (in which the respective surfaces 11a, 12, 13 may be tilted with respect to one another) depending on the characteristics of the sensor elements (vibration gyro elements 30).

Note that the sensor module 1 may not necessarily use the flexible wiring boards 40, 40a. In this case, in the sensor module 1, the external connection terminal 23 of the IC chip 20 is attached (bonded) to the external member by other bonding means such as wire bonding or a conducting adhesive.

Second Embodiment

Figure 9A:
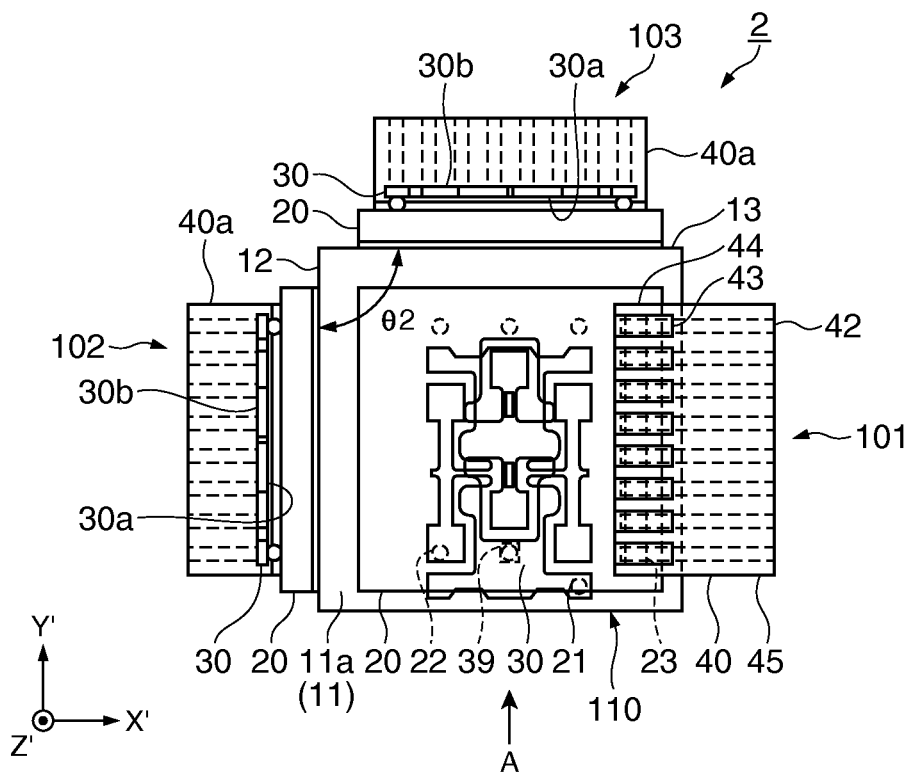
FIGS. 9A and 9B are diagrams showing a schematic configuration of a sensor module of the second embodiment.
Figure 9B:
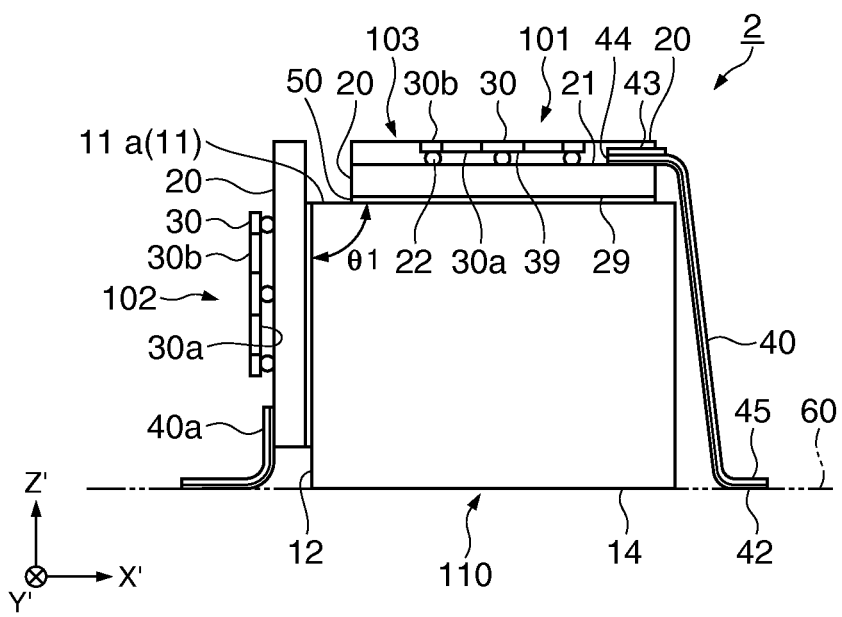

FIGS. 9A and 9B are diagrams showing a schematic configuration of a sensor module of the second embodiment. FIG. 9A is a plan view and FIG. 9B is a side view as seen from a direction of arrow A in FIG. 9A.

Note that the same signs are assigned to the parts in common with the first embodiment and their explanation will be omitted, and the different parts from those of the first embodiment will be centered in explanation.

As shown in FIGS. 9A and 9B, in a sensor module 2, a support member 110 has a rectangular parallelepiped shape of only the support member base part formed by removing the first and second side wall parts (the parts in which the side surfaces 11b, 11c in FIG. 1B are provided) from the support member 10 of the first embodiment. Thereby, in the sensor module 2, a support surface 11a also serves as the first flat surface 11.

Further, thereby, in the sensor module 2, the IC chips 20 of the sensor units 102, 103 project more upwardly than the support surface 11a of the support member 110.

In the sensor module 2, since the side wall parts are unnecessary for the support member 110, the planar size of the support member 110 may be made smaller than that of the first embodiment by the parts. As a result, the sensor module 2 may be further reduced in size.

Further, in the sensor module 2, since the support member 110 has the rectangular parallelepiped shape, manufacturing of the support member 110 is easier than that of the first embodiment.

Thereby, the sensor module 2 may improve the productivity.

Third Embodiment

Figure 10A:
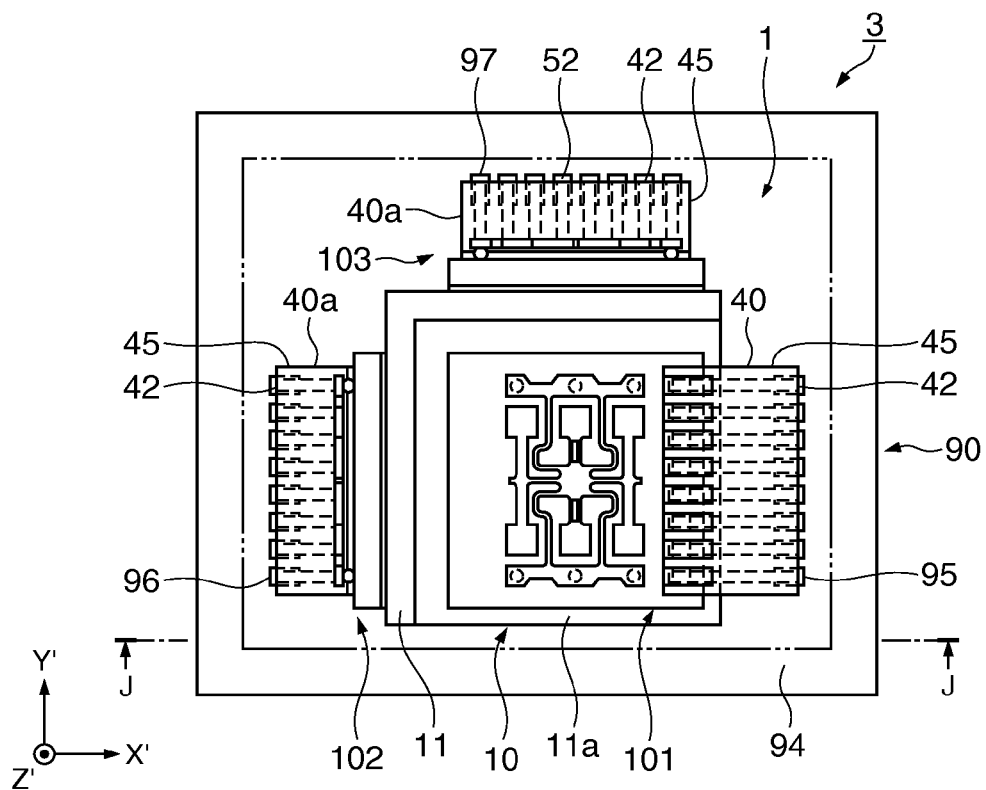
FIGS. 10A and 10B are diagrams showing a schematic configuration of a gyro sensor of the third embodiment.
Figure 10B:
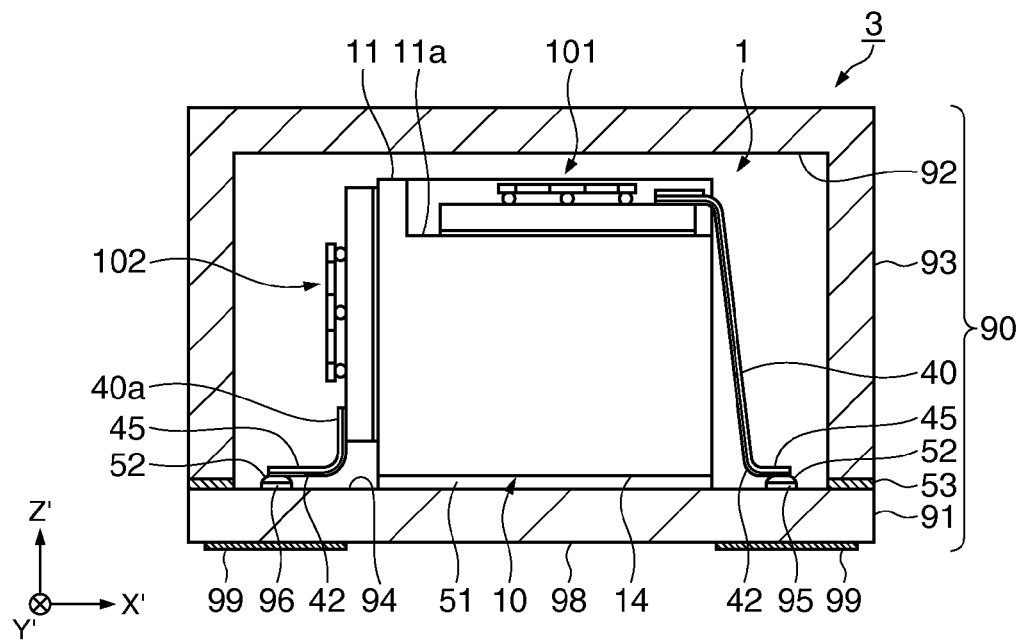

FIGS. 10A and 10B are diagrams showing a schematic configuration of a gyro sensor as a sensor device of the third embodiment. FIG. 10A is a plan downward view from a lid side and FIG. 10B is a sectional view along J-J line in FIG. 10A.

Note that, in the plan view, the lid is omitted for convenience and the inner wall shape of the lid is shown by a chain double-dashed line.

Further, the same signs are assigned to the parts in common with the first embodiment and their explanation will be omitted, and the different parts from those of the first embodiment will be centered in explanation.

As shown in FIGS. 10A and 10B, a gyro sensor 3 has the sensor module 1 and a package 90 housing the sensor module 1, and the sensor module 1 is placed and housed within the package 90.

The package 90 includes a package base 91 having a rectangular flat plate shape, a lid 93 that has a recessed part 92 and covers the package base 91, etc.

For the package base 91, alumina ceramics formed by forming and sintering a ceramic green sheet, quartz, glass, or the like is used.

For the lid 93, the same material as that of the package base 91, or a metal such as kovar, 42-alloy, or stainless steel is used.

On an upper surface 94 of the package base 91 (the surface covered by the lid 93), internal terminals 95, 96, 97 are provided in locations corresponding to the flexible wiring boards 40, 40a of the respective sensor units 101, 102, 103 of the sensor module 1.

On a lower surface 98 of the package base 91 (the bottom surface of the package 90, along the upper surface 94), plural external terminals 99 used when mounted on an external device (external member) or the like are provided.

The internal terminals 95, 96, 97 are connected to the external terminals 99 by internal wires (not shown).

The internal terminals 95, 96, 97 and the external terminals 99 include metallic coatings formed by stacking respective coatings of nickel (Ni), gold (Au), or the like on metallization layers of tungsten (W), molybdenum (Mo), or the like, for example.

Note that the package may include a package base having a recessed part and a lid having a flat plate shape and covering the package base. Further, the package may have recessed parts on both the package base and the lid.

The sensor module 1 is placed on the upper surface 94 of the package base 91 and the fourth flat surface 14 opposed to the first flat surface 11 (support surface 11a) as the attachment surface to the external member (here, the package base 91) is attached to the upper surface 94 by a bonding member 51 of an adhesive or the like.

Further, in the sensor module 1, the wiring pattern layer 42 of the other end 45 in the flexible wiring board 40 of the sensor unit 101 is attached to the inner terminal 95 of the package base 91 by a bonding member 52 having conductivity such as a conducting adhesive, an anisotropic conducting film, or solder.

Similarly, in the sensor module 1, the wiring pattern layer 42 of the other end 45 in the flexible wiring board 40a of the sensor unit 102 is attached to the inner terminal 96 of the package base 91 by the bonding member 52.

Further, similarly, in the sensor module 1, the wiring pattern layer 42 of the other end 45 in the flexible wiring board 40a of the sensor unit 103 is attached to the inner terminal 97 of the package base 91 by the bonding member 52.

According to the configuration, in the gyro sensor 3, the respective sensor units 101, 102, 103 of the sensor module 1 and the internal terminals 95, 96, 97, and the external terminals 99 are electrically connected with each other.

In the gyro sensor 3, under the condition that the sensor module 1 is attached to the upper surface 94 of the package base 91 as described above, the package base 91 is covered by the lid 93 and the lid 93 is attached to the package base 91 by a bonding member 53 such as a seam ring, low-melting-point glass, or an adhesive, and thereby, the interior of the package 90 is air-tightly sealed.

Note that it is preferable that the interior of the package 90 is held in a vacuum state (a state with a high degree of vacuum) so as not to hinder the vibration of the vibration gyro elements 30 of the respective sensor units 101, 102, 103.

The gyro sensor 3 is a gyro sensor corresponding to three axes including the sensor module 1 that detects the angular velocities with respect to the three axes of X'-axis, Y'-axis, Z'-axis orthogonal to one another within the package 90.

Accordingly, the gyro sensor 3 is used for hand shake compensation of an imaging apparatus, position detection, position control, or the like of a vehicle in a mobile navigation system using GPS (Global Positioning System) satellite signals, etc.

Here, an example of a manufacturing method of the gyro sensor 3 will be explained.

Figure 11:
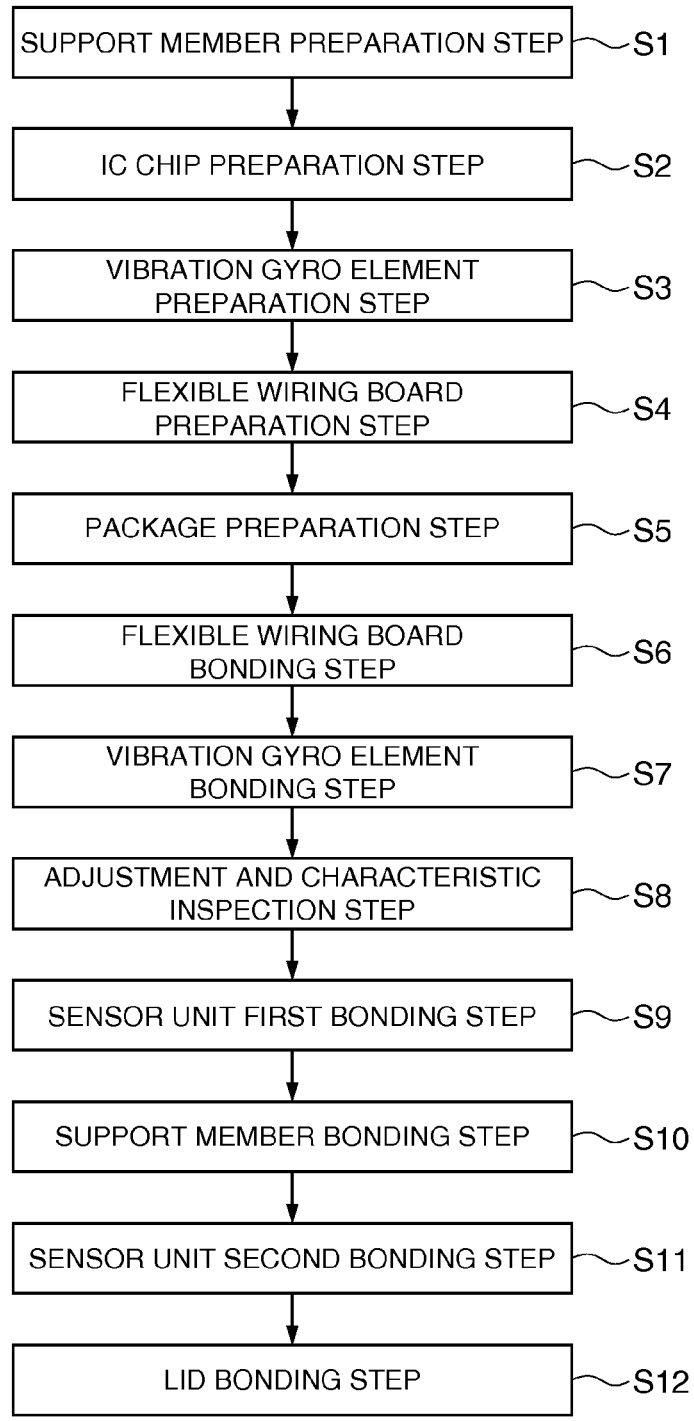
FIG. 11 is a flowchart showing a manufacturing process of the gyro sensor.

FIG. 11 is a flowchart showing a manufacturing process of the gyro sensor, and FIGS. 12 to 17B are schematic diagrams for explanation of main manufacturing steps.

As shown in FIG. 11, the manufacturing method of the gyro sensor 3 includes a support member preparation step S1, an IC chip preparation step S2, a vibration gyro element preparation step S3, a flexible wiring board preparation step S4, a package preparation step S5, a flexible wiring board bonding step S6, a vibration gyro element bonding step S7, an adjustment and characteristic inspection step S8, a sensor unit first bonding step S9, a support member bonding step S10, a sensor unit second bonding step S11, and a lid bonding step S12.

Support Member Preparation Step S1

Figure 12:
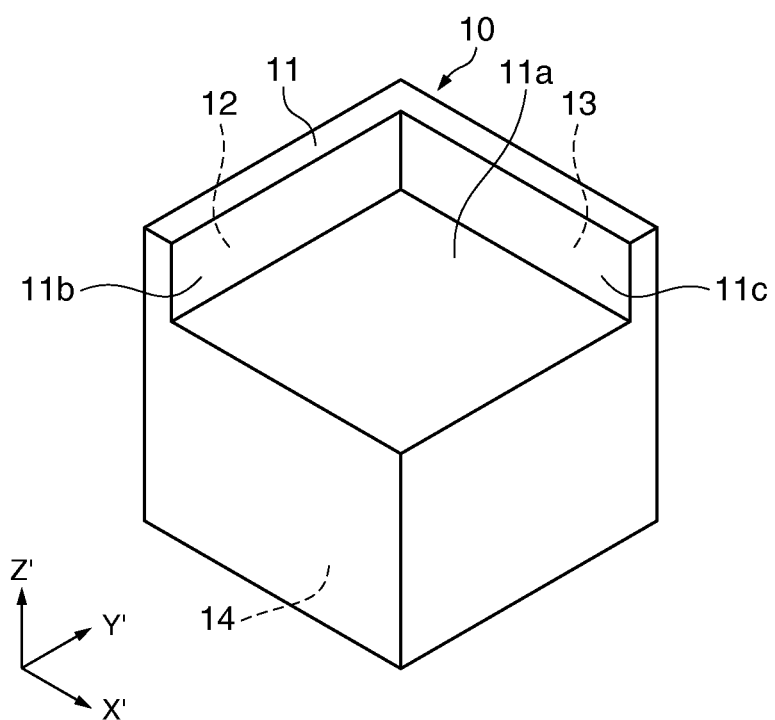
FIG. 12 is a schematic perspective view for explanation of a support member preparation step.

First, as shown in FIG. 12, the support member 10 having the above described first flat surface 11 (support surface 11a), second flat surface 12, and third surface 13 orthogonal to one another and fourth flat surface opposed to the first flat surface 11 (support surface 11a) as the attachment surface to the external member is prepared.

IC Chip Preparation Step S2

Figure 13A:
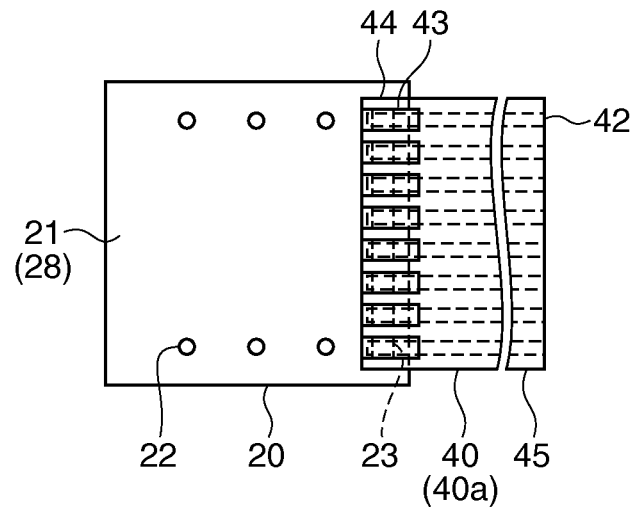
FIGS. 13A and 13B are diagrams for explanation of a flexible wiring board bonding step.
Figure 13B:
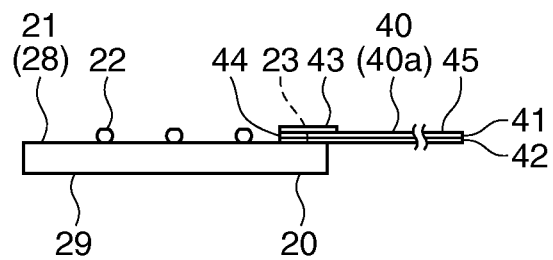

Then, the IC chip 20 having the connection terminal 22 and the external connection terminal 23 on the active surface 21 side is prepared (see FIGS. 13A and 13B).

Vibration Gyro Element Preparation Step S3

Then, the vibration gyro element 30 having a base part 31, the respective vibrating arms (32a etc.) extended from the base part 31, the connection electrodes 39 provided in the respective supporting parts 38a, 38b as shown in FIG. 4 is prepared.

Flexible Wiring Board Preparation Step S4

Then, the flexible wiring boards 40, 40a having flexibility are prepared (see FIGS. 13A and 13B). Note that, as described above, in the flexible wiring board 40, the reinforcing layers 43 for improving stiffness are provided in the range from the attachment region to the external connection terminal 23 of the IC chip 20 over the end 20a of the IC chip 20.

Package Preparation Step S5

Then, the package 90 (the package base 91, the lid 93, etc.) housing the respective component elements is prepared (see FIGS. 10A and 10B).

Note that the order of the respective preparation steps S1 to S5 is not limited to the above described order, but may be in random order.

Flexible Wiring Board Bonding Step S6

Then, as shown in FIGS. 13A and 13B, the wiring pattern layers 42 of one ends 44 of the flexible wiring boards 40, 40a are attached (bonded) to the external connection terminals 23 of the IC chips 20 using an ultrasonic bonding method, a heating and pressurizing bonding method, or the like (see FIG. 3 for details of the bonding parts).

Note that, in FIGS. 13A and 13B, the flexible wiring boards 40, 40a are placed and attached onto the IC chips 20, however, the flexible wiring boards 40, 40a may be inverted and placed on a stage (working bench), inverted IC chips 20 may be placed on the flexible wiring boards 40, 40a, and the external connection terminals 23 of the IC chips 20 may be attached to the wiring pattern layers 42 of the flexible wiring boards 40, 40a.

Vibration Gyro Element Bonding Step S7

Figure 14A:
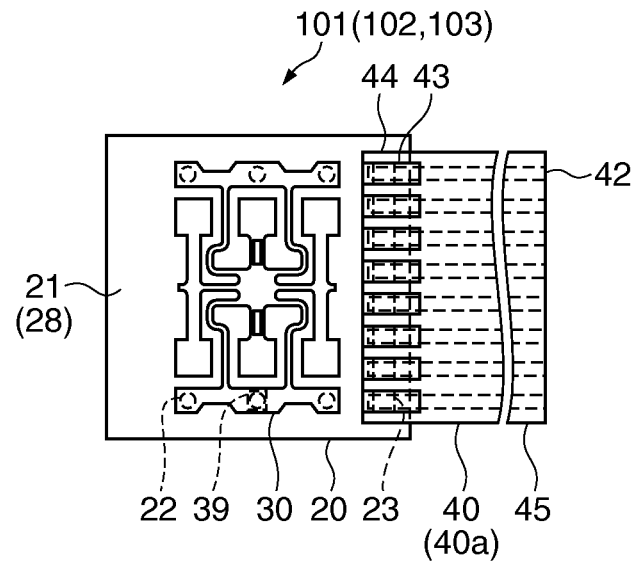
FIGS. 14A and 14B are diagrams for explanation of a vibration gyro element bonding step.
Figure 14B:
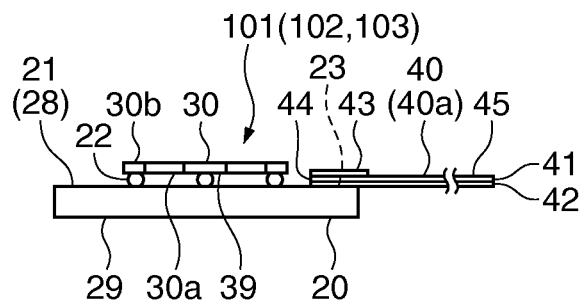

Then, as shown in FIGS. 14A and 14B, the vibration gyro elements 30 are provided on the active surface 21 (second insulating layer 28) sides of the IC chips 20, and the connection electrodes 39 of the vibration gyro elements 30 are attached (bonded) to the connection terminals 22 of the IC chips 20 so that one principal surfaces 30a (the other principal surfaces 30b) of the vibration gyro elements 30 may be along (nearly in parallel to) the active surfaces 21 (second insulating layers 28) or the inactive surfaces 29 (see FIG. 3 for details of the bonding parts).

Thereby, the sensor units 101, 102, 103 in which the vibration gyro elements 30 and the flexible wiring boards 40, 40a are attached to the IC chips 20 are obtained.

Adjustment and Characteristic Inspection Step S8

Then, adjustment and characteristic inspection of the vibration gyro elements 30 and the IC chips 20 are performed via the flexible wiring boards 40, 40a.

Specifically, the sensor units 101, 102, 103 are set in an adjustment apparatus and a characteristic inspection apparatus (not shown) and the metallic coatings of gold (Au), silver (Ag), chromium (Cr), etc. provided in the respective weight parts of the respective vibrating arms of the vibration gyro elements 30 are removed by laser application, and thereby, the adjustment work of balance tuning of balancing the masses of the respective vibrating arms and various kinds of characteristic inspection of the vibration gyro elements 30 and the IC chips 20 are performed.

Sensor Unit First Bonding Step S9

Figure 15A:
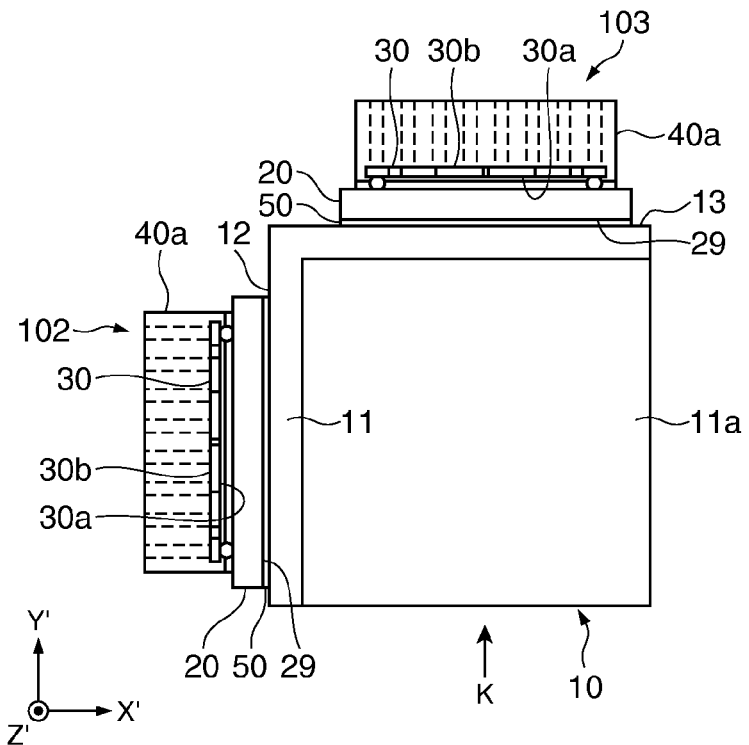
FIGS. 15A and 15B are diagrams for explanation of a sensor unit first bonding step.
Figure 15B:
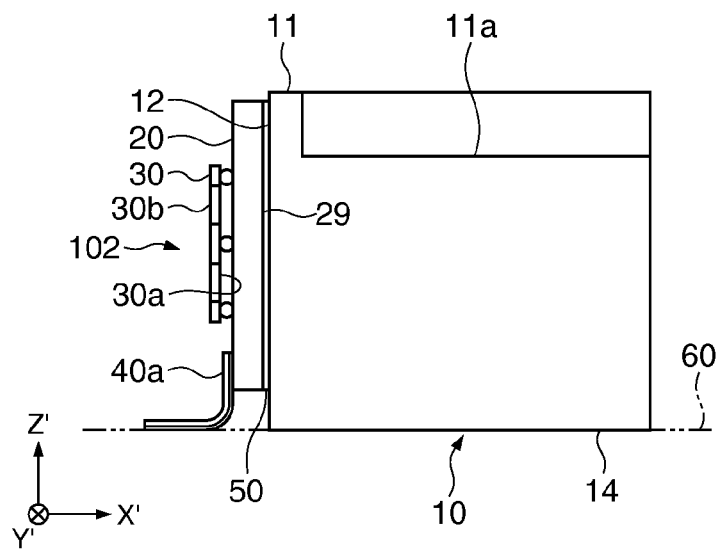

Then, as shown in FIGS. 15A and 15B, the sensor units 102, 103 are attached to (bonded to) the second flat surface 12, the third flat surface 13 of the support member 10.

Specifically, the inactive surface 29 sides of the IC chips 20 of the sensor units 102, 103 are attached to the second flat surface 12, the third flat surface 13 as surfaces at right angles with respect to the upper surface 94 of the package base 91 as the support member bonding surface of the package 90 among the respective surfaces 11a, 12, 13 in the support member 10 under the insulated condition from the support member 10 by the insulating adhesives 50.

That is, the sensor unit 102 is attached to the second flat surface 12 and the sensor unit 103 is attached to the third flat surface 13.

In this regard, one principal surfaces 30a (the other principal surfaces 30b) of the vibration gyro elements 30 may be along the second flat surface 12 and the third flat surface 13, respectively.

Support Member Bonding Step S10

Figure 16A:
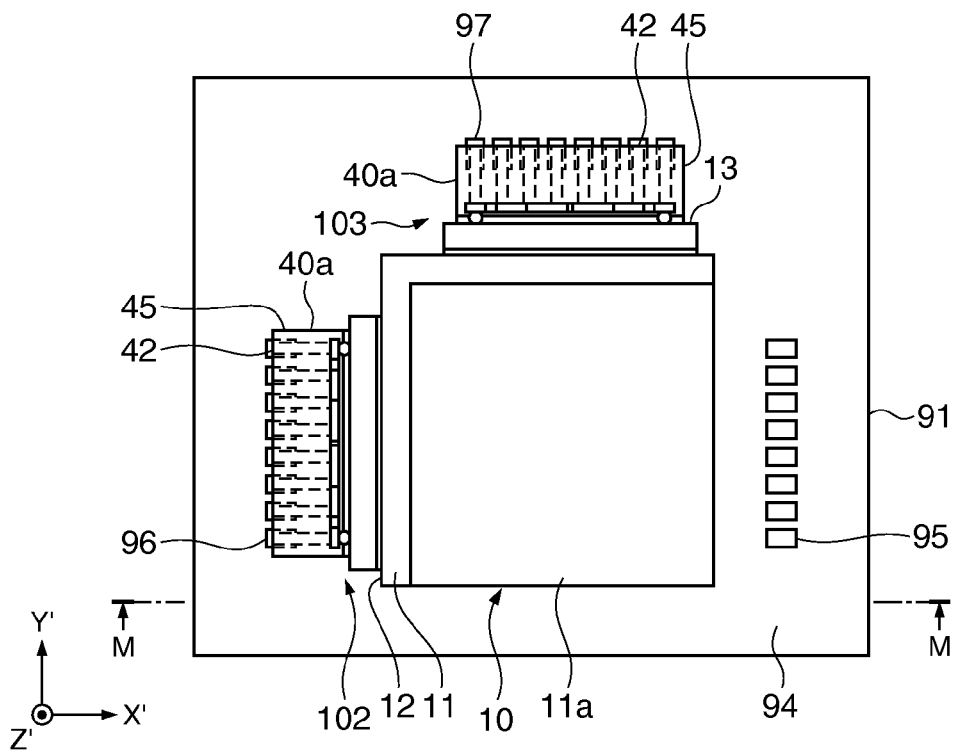
FIGS. 16A and 16B are diagrams for explanation of a support member bonding step.
Figure 16B:
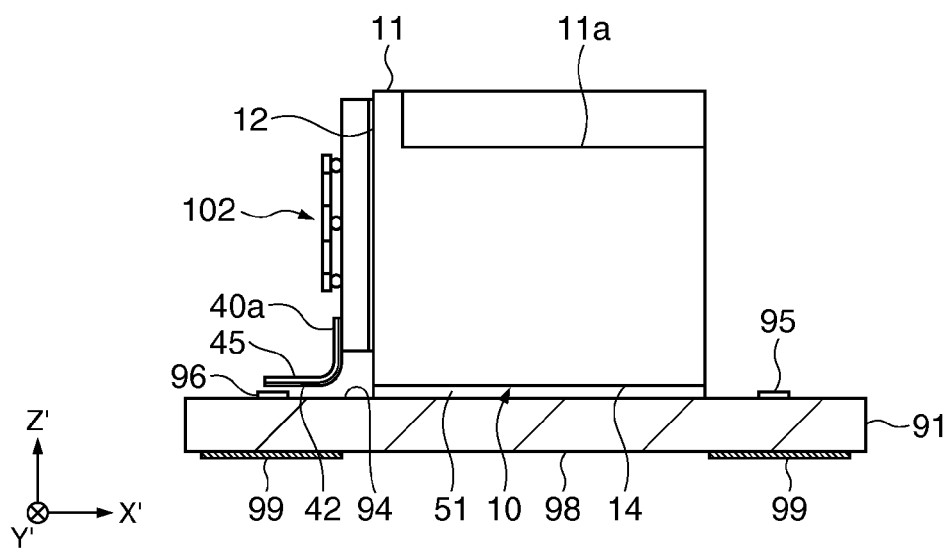

Then, as shown in FIGS. 16A and 16B, the support surface 11a along the upper surface 94 of the package base 91 is suctioned by a suction unit (not shown) and the support member 10 on which the respective sensor units 102, 103 have been attached is transported, and the fourth flat surface 14 of the support member 10 is attached to the upper surface 94 of the package base 91 using the adhesive member 51.

Note that, in view of prevention of short circuit, an adhesive having an insulation property is preferable for the bonding member 51.

Sensor Unit Second Bonding Step S11

Figure 17A:
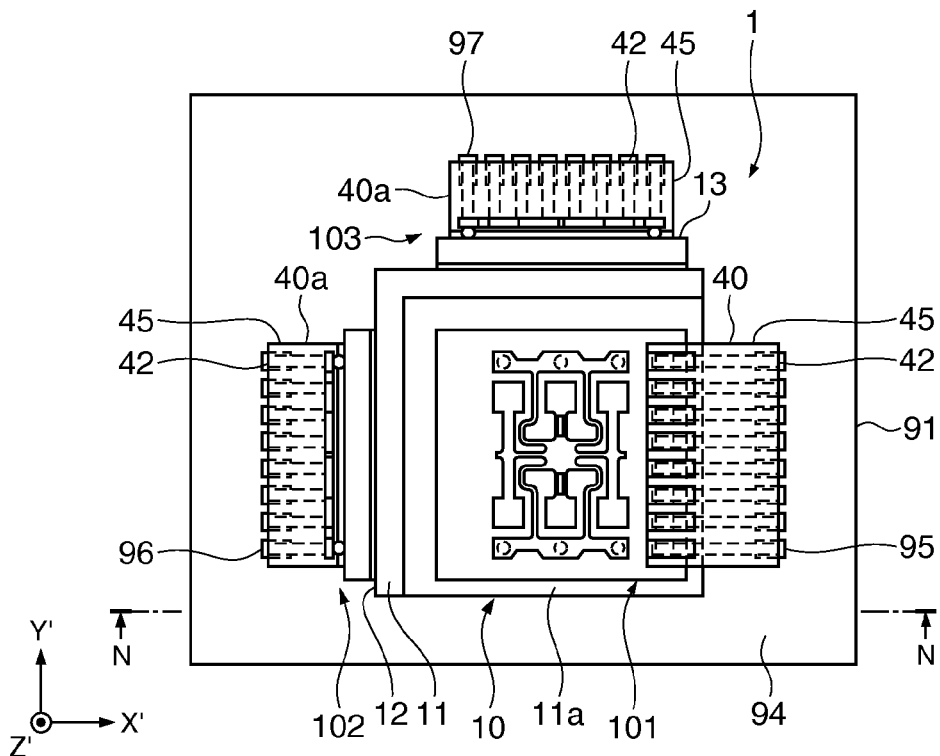
FIGS. 17A and 17B are diagrams for explanation of a sensor unit second bonding step.
Figure 17B:
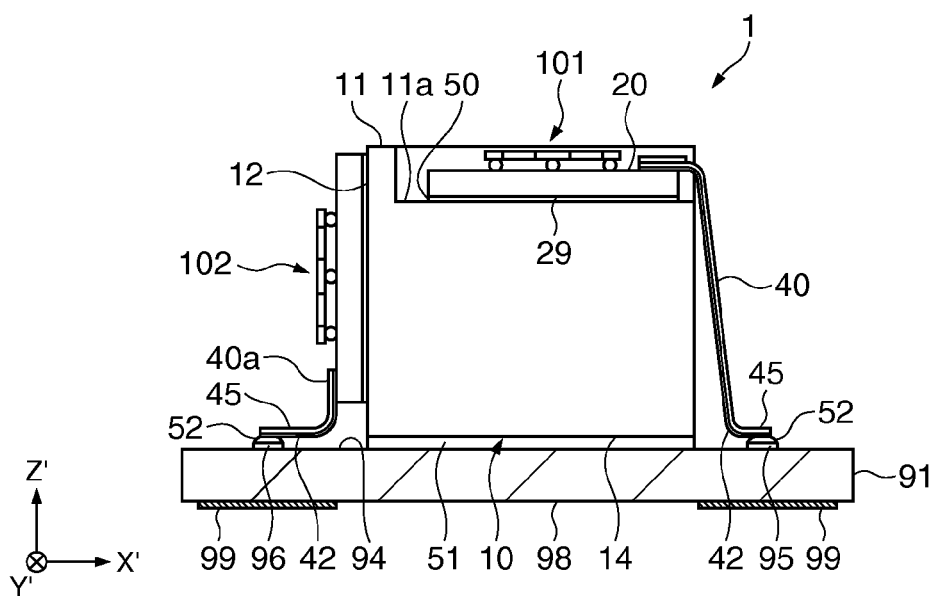

Then, as shown in FIGS. 17A and 17B, the sensor unit 101 is attached to the support surface 11a along the upper surface 94 of the package base 91.

Specifically, the inactive surface 29 side of the IC chip 20 of the sensor unit 101 is attached to the support surface 11a of the support member 10 under the insulated condition from the support member 10 using the insulating adhesive 50.

Then, the wiring patterns 42 of the other ends 45 in the flexible wiring boards 40, 40a of the sensor units 101, 102, 103 are attached to the internal terminals 95, 96, 97 of the upper surface 94 of the package base 91 by the bonding members 52, respectively.

Thereby, the sensor module 1 is formed and the sensor module 1 is provided within the package 90.

Lid Bonding Step S12

Then, returning to FIGS. 10A and 10B, the lid 93 is attached to the package base 91 by the bonding member 53 in the vacuum state (the state with a high degree of vacuum) and the interior of the package 90 is air-tightly sealed. Thereby, the interior of the package 90 is held in the vacuum state. Further, thereby, the sensor module 1 is housed within the package 90.

Note that, after attachment of the lid 93 to the package base 91 in the air, the interior of the package 90 may be decompressed via a through hole provided in the package base 91 or the lid 93 and the through hole may be sealed, and thereby, the interior of the package 90 may be held in the vacuum state (the state with the high degree of vacuum).

Through the respective steps, the gyro sensor 3 as shown in FIGS. 10A and 10B is obtained.

Note that the respective steps may appropriately be exchanged in the order according to need. For example, the support member preparation step S1 may be immediately before the sensor unit first bonding step S9, the package preparation step S5 may be immediately before the support member bonding step S10, and the flexible wiring board bonding step S6 and the vibration gyro element bonding step S7 may be exchanged in the order.

At the sensor unit first bonding step S9, the flexible wiring boards 40a of the sensor units 102, 103 may be attached to the internal terminals 96, 97.

As described above, the gyro sensor 3 of the third embodiment may have the same advantages as those of the first embodiment because the sensor module 1 of the first embodiment is housed in the package 90.

As a main advantage, in the gyro sensor 3, the sensor module 1 corresponding to the three axes of the X'-axis, the Y'-axis, and the Z'-axis is housed within one package 90, and a gyro sensor corresponding to three axes may be provided.

In this regard, in the gyro sensor 3, the support surface 11a of the first flat surface 11 of the support member 10 of the sensor module 1 is depressed (recessed) from the first flat surface 11, and thus, the height from the fourth flat surface 14 as the attachment surface to the package base 91 to the vibration gyro element 30 of the sensor unit 101 attached to the support surface 11a may be made lower (the profile may be lower) than that in the related art configuration of Patent Document 1.

Thereby, the gyro sensor 3 may provide a gyro sensor corresponding to three axes and having a reduced thickness.

Further, in the gyro sensor 3, the flexible wiring board 40 is attached to the external connection terminal 23 of the IC chip 20 of the sensor unit 101 and the reinforcing layers 43 for improvement of the stiffness are provided on the opposite surface to the IC chip 20 side in the flexible wiring board 40 over the range from the attachment region to the external connection terminal 23 of the IC chip 20 beyond the end 20a of the IC chip 20.

Thereby, in the gyro sensor 3, the stiffness of the flexible wiring board 40 is improved over the range from the attachment region to the external connection terminal 23 of the IC chip 20 beyond the end 20a of the IC chip 20 in the flexible wiring board 40.

Therefore, in the gyro sensor 3, when the sensor module 1 is attached to the package 90, the flexible wiring board 40 is hard to easily bend (deflect) into contact with the end 20a of the IC chip 20.

As a result, in the gyro sensor 3, for example, in the case where the active surface 21 is exposed in the end 20a of the IC chip 20 or the like, short circuit between the wiring pattern layer 42 of the flexible wiring board 40 and the IC chip 20 due to contact between the flexible wiring board 40 and the IC chip 20 and short circuit between the wiring patterns of the wiring pattern layer 42 via the IC chip 20 may be avoided.

Note that, in the gyro sensor 3, by removing one of the respective sensor units 101, 102, 103 of the sensor module 1, a gyro sensor corresponding to two axes may be provided.

Further, in the gyro sensor 3, by leaving one of the respective sensor units 101, 102, 103 of the sensor module 1 (removing the other two), a gyro sensor corresponding to one axis without requiring changes of attachment position of the package 90 may be provided regardless of the directions of the detection axes (X'-axis, the Y'-axis, the Z'-axis).

Furthermore, a manufacturing method of the gyro sensor 3 may manufacture and provide a gyro sensor having the above described advantages.

In addition, in the manufacturing method of the gyro sensor 3, the sensor units 102, 103 are attached to the second flat surface 12, the third flat surface 13 at right angles with respect to the upper surface 94 of the package base 91 among the respective surfaces 11a, 12, 13 in the support member 10 prior to bonding to the support surface 11a.

Thereby, in the manufacturing method of the gyro sensor 3, the support member 10 may be held by suctioning the support surface 11a along the upper surface 94 of the package base 91 in the support member 10, to which the sensor unit 101 has not been bonded, using a suction unit or the like, and thereby, handling (transportation) of the support member 10 may become easier.

As a result, in the manufacturing method of the gyro sensor 3, attachment of the support member 10 on which the sensor units 102, 103 have been attached to the package base 91 becomes easier, and thereby, productivity may be improved.

Note that the gyro sensor 3 may use the sensor module 2 of the second embodiment in place of the sensor module 1.

According to the configuration, the gyro sensor 3 may provide a gyro sensor having the above described advantages and the advantages unique to the second embodiment.

Note that, in the respective embodiments, the base material of the vibration gyro element 30 has been quartz, however, not limited to that, but may include a piezoelectric material of lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN), or a semiconductor of silicon or the like.

Further, as the vibration gyro element 30, various other vibration gyro elements (sensor elements) of a double tuning fork, a trident tuning fork, H-shape, comb-shape, orthogonal shape, prismatic shape, etc. than the doubler-shape may be used.

Furthermore, the gyro element may not be the vibration type.

In addition, the drive method and detection method of vibration of the vibration gyro element 30 may be not only by the piezoelectric type using the piezoelectric effect of the piezoelectric material, but also an electrostatic type using Coulomb force, a Lorentz type using magnetic force, or the like.

Further, the sensing axis of the sensor element may be not only the axis orthogonal to the principal surface of the sensor element but also an axis in parallel to the principal surface of the sensor element.

Furthermore, in the respective embodiments, the vibration gyro element has been exemplified as the sensor element of the sensor module, however, not limited to that, for example, an acceleration sensing element that reacts with acceleration, a pressure sensing element that reacts pressure, a weight sensing element that reacts a weight, or the like may be used.

In addition, in the third embodiment, the gyro sensor has been exemplified as the sensor device, however, not limited to that, for example, an acceleration sensor using a sensor module having the acceleration sensing element, a pressure sensor using a sensor module having the pressure sensing element, a weight sensor using a sensor module having the weight sensing element, or the like may be used.

Electronic Apparatus

The sensor devices such as the gyro sensor, the acceleration sensor, the pressure sensor, and the weight sensor may preferably be used as devices having sensing functions for an electronic apparatus of a digital still camera, a video camera, a navigation system, a vehicle position detector, a pointing device, a game controller, a cellular phone, a head attached display, or the like, and, in any case, an electronic apparatus having the advantages that have been explained in the respective embodiments may be provided.

The entire disclosure of Japanese Patent Application No. 2011-085161 filed Apr. 7, 2011 is expressly incorporated by reference herein.

What is claimed is:

1. A sensor module comprising:
   a support member having a first support surface provided in parallel to a first reference plane within a depression and a second support surface in parallel to a second reference plane, the second reference plane being angled with respect to the first reference plane;
   a first IC chip attached to the first support surface and having a first connection terminal on one surface side, the other surface side along the one surface being an attachment surface to the first support surface;
   a second IC chip attached to the second support surface and having a second connection terminal on one surface side, the other surface side along the one surface being an attachment surface to the second support surface;
   a first sensor element provided above the one surface side of the first IC chip with a principal surface along the one surface and having a first connection electrode attached to the first connection terminal; and a second sensor element provided above the one surface side of the second IC chip with a principal surface along the one surface and having a second connection electrode attached to the second connection terminal.

2. The sensor module according to claim 1, wherein a depth dimension of the depression is larger than a height dimension from the first support surface to the first sensor element.

3. The sensor module according to claim 1, wherein the support member includes a support member base part having a rectangular parallelepiped shape and a side wall part projecting from the support member base part, the second support surface is provided over the support member base part and the side wall part, a thickness dimension of the support member base part is larger than a thickness dimension of the side wall part in a thickness direction of the second sensor element, the second IC chip has an attachment area to the support member base part larger than an attachment area to the side wall part, and at least a part of the second sensor element overlaps with the support member base part in a side view from a direction orthogonal to the principal surface of the second sensor element.

4. The sensor module according to claim 1, wherein at least one of the first and second IC chips has an external connection terminal at the one surface side, and a flexible wiring board is attached to the external connection terminal.

5. The sensor module according to claim 4, wherein a reinforcing part for improvement of stiffness of the flexible wiring board is provided on an opposite surface to the first and second IC chips side of the flexible wiring board in a range from an attachment region to the external connection terminal beyond ends of the first and second IC chips in a plan view.

6. The sensor module according to claim 5, wherein the reinforcing part of the flexible wiring board contains a metal.

7. The sensor module according to claim 1, wherein the first and second connection terminals of the first and second IC chips are projection electrodes projecting toward the one surface sides.

8. The sensor module according to claim 1, wherein a recessed part is provided above at least one of the first support surface and the second support surface.

9. A sensor device comprising:
the sensor module according to claim 1; and
a package that houses the sensor module,
wherein the sensor module is housed within the package.

10. A sensor device comprising:
the sensor module according to claim 2; and
a package that houses the sensor module,
wherein the sensor module is housed within the package.

11. A sensor device comprising:
the sensor module according to claim 3; and
a package that houses the sensor module,
wherein the sensor module is housed within the package.

12. A sensor device comprising:
the sensor module according to claim 4; and
a package that houses the sensor module,
wherein the sensor module is housed within the package.

13. A sensor device comprising:
the sensor module according to claim 5; and
a package that houses the sensor module,
wherein the sensor module is housed within the package.

14. An electronic apparatus comprising the sensor module according to claim 1.

15. An electronic apparatus comprising the sensor module according to claim 2.

16. An electronic apparatus comprising the sensor module according to claim 3.

17. An electronic apparatus comprising the sensor module according to claim 4.

18. An electronic apparatus comprising the sensor module according to claim 5.

19. A manufacturing method of a sensor device comprising:

preparing a support member having a first support surface provided in parallel to a first reference plane within a depression and a second support surface in parallel to a second reference plane, the second reference plane being angled with respect to the first reference plane;

preparing a first IC chip having a first connection terminal and an external connection terminal on one surface side, the other surface side along the one surface being an attachment surface to the first support surface, and a second IC chip having a second connection terminal and an external connection terminal on one surface side, the other surface side along the one surface being an attachment surface to the second support surface;

preparing a first sensor element having a first connection electrode and a second sensor element having a second connection electrode;

preparing plural flexible wiring boards with a reinforcing part for improvement of stiffness provided above an opposite surface to the first and second IC chips side of at least one of the flexible wiring boards in ranges from attachment regions to the external connection terminals of the first and second IC chips beyond ends of the first and second IC chips in a plan view;

preparing a package that houses the respective component elements;

attaching the flexible wiring boards respectively to the external connection terminals of the first and second IC chips;

providing the first and second sensor elements above the one surface sides of the first and second IC chips, and attaching the first and second connection electrodes of the first and second sensor elements to the first and second connection terminals of the first and second IC chips so that principal surfaces of the first and second sensor elements may be along the one surfaces or the other surfaces;

performing adjustment and characteristic inspection of the first and second sensor elements and the first and second IC chips via the flexible wiring boards;

of plural sensor units respectively including the first and second IC chips to which the first and second sensor elements and the flexible wiring boards have been attached, attaching a second sensor unit including the second IC chip to the second support surface of the support member on the other surface side of the second IC chip;

attaching an opposite surface to the first support surface of the support member, to which the second sensor unit has been attached, to a support member bonding surface of the package;

attaching the first sensor unit including the first IC chip, to which the flexible wiring board having the reinforcing part has been attached, to the first support surface of the support member that has been attached to the support member bonding surface of the package on the other surface side of the first IC chip; and attaching the flexible wiring boards of the first and the second sensor units to the support member bonding surface of the package.

20. The sensor module according to claim 1, wherein
the first reference plane is orthogonal to the second reference plane.

21. The manufacturing method according to claim 19, wherein
the first reference plane is orthogonal to the second reference plane.

* * * * *